United States Patent
Kaise et al.

(10) Patent No.: US 7,667,829 B2
(45) Date of Patent: Feb. 23, 2010

(54) OPTICAL PROPERTY MEASUREMENT APPARATUS AND OPTICAL PROPERTY MEASUREMENT METHOD, EXPOSURE APPARATUS AND EXPOSURE METHOD, AND DEVICE MANUFACTURING METHOD

(75) Inventors: Koji Kaise, Kumagaya (JP); Toru Fujii, Hiki-gun (JP); Yasushi Mizuno, Saitama (JP)

(73) Assignee: Nikon Corporation, Tokyo (JP)

( * ) Notice: Subject to any disclaimer, the term of this patent is extended or adjusted under 35 U.S.C. 154(b) by 424 days.

(21) Appl. No.: 11/659,571

(22) PCT Filed: Aug. 9, 2005

(86) PCT No.: PCT/JP2005/014585

§ 371 (c)(1),
(2), (4) Date: Feb. 7, 2007

(87) PCT Pub. No.: WO2006/016584

PCT Pub. Date: Feb. 16, 2006

(65) Prior Publication Data

US 2008/0043236 A1    Feb. 21, 2008

(30) Foreign Application Priority Data

Aug. 9, 2004   (JP)   ............................. 2004-232370

(51) Int. Cl.
*G01N 21/00*   (2006.01)
*G01J 4/00*   (2006.01)
(52) U.S. Cl. .......................... 356/73; 356/124; 356/364
(58) Field of Classification Search .................. 356/72, 356/73, 124, 124.5, 125, 126, 127, 364, 239.2; 355/53
See application file for complete search history.

(56) References Cited

U.S. PATENT DOCUMENTS

| 5,448,332 A |   | 9/1995 | Sakakibara et al. |
| 5,657,116 A | * | 8/1997 | Kohayakawa ................ 356/124 |
| 5,859,707 A |   | 1/1999 | Nakagawa et al. |
| 2004/0095550 A1 |   | 5/2004 | Tai |

(Continued)

FOREIGN PATENT DOCUMENTS

EP        1 429 128 A1     6/2004

(Continued)

OTHER PUBLICATIONS

Brunner, Timothy A. et al., "High NA Lithographic Imagery at Brewster's Angle," Optical Microlithography XV, Proceedings of SPIE, vol. 4691 (2002).

*Primary Examiner*—F. L Evans
(74) *Attorney, Agent, or Firm*—Oliff & Berridge, PLC

(57) ABSTRACT

An optical property measurement apparatus is equipped with an optical system unit that selectively places an opening section for passing illumination light, a microlens array for measuring wavefront aberration, and a polarization detection system for measuring a polarization state of the illumination light on an optical path of the illumination light. Accordingly an illumination shape and a size of an illumination optical system, wavefront aberration of a projection optical system and a polarization state of the illumination light can be measured together. Therefore, for example, even when exposure is performed with polarized illumination that is a type of modified illumination, highly-accurate exposure can be achieved by adjusting various optical systems based on the measurement results.

26 Claims, 15 Drawing Sheets

U.S. PATENT DOCUMENTS

| | | |
|---|---|---|
| 2004/0114150 A1 | 6/2004 | Wegmann et al. |
| 2004/0156051 A1 | 8/2004 | Takeuchi et al. |
| 2004/0262500 A1 | 12/2004 | Mengel |
| 2006/0055834 A1 | 3/2006 | Tanitsu et al. |

FOREIGN PATENT DOCUMENTS

| | | |
|---|---|---|
| JP | A 05-018856 | 1/1993 |
| JP | A 06-053120 | 2/1994 |
| JP | A 2003-133207 | 5/2003 |
| JP | A 2004-061515 | 2/2004 |
| JP | A 2004-163313 | 6/2004 |
| JP | A 2004-165483 | 6/2004 |
| JP | A 2004-205500 | 7/2004 |

\* cited by examiner

ROTATION AMOUNT

OPTICAL PROPERTY MEASUREMENT APPARATUS AND OPTICAL PROPERTY MEASUREMENT METHOD, EXPOSURE APPARATUS AND EXPOSURE METHOD, AND DEVICE MANUFACTURING METHOD

TECHNICAL FIELD

The present invention relates to optical property measurement apparatuses and optical property measurement methods, exposure apparatuses and exposure methods, and device manufacturing methods, and more particularly to an optical property measurement apparatus and an optical property measurement method that measures optical properties of an optical system to be examined, an exposure apparatus that is equipped with the optical property measurement apparatus and an exposure method in which the optical property measurement method is used, and a device manufacturing method in which the exposure method is used.

BACKGROUND ART

Conventionally, in a lithography process for manufacturing electron devices such as semiconductor devices (integrated circuits) and liquid crystal display devices, a projection exposure apparatus that transfers an image of a pattern of a mask or a reticle (hereinafter generally referred to as a 'reticle') to each shot area on a photosensitive substrate such as a wafer or a glass plate coated with resist (photosensitive agent) (hereinafter referred to as a 'substrate' or 'wafer') via a projection optical system is used. As this type of projection exposure apparatus, conventionally a reduction projection exposure apparatus by a step-and-repeat method (the so-called stepper) has been mainly used, however, recently, a projection exposure apparatus by a step-and-scan method (the so-called scanning stepper) that performs exposure while synchronously scanning a reticle and a wafer is gathering attention.

In such a projection exposure apparatus, it is required to transfer a finer pattern with a high resolution to cope with higher integration of semiconductor devices and the like. As a method to achieve this aim, the so-called super-resolution technology such as annular (ring-shaped) illumination, bipolar illumination and quadrupole illumination, and the like, which improve the resolution by setting an incident angle of illumination light to a reticle to a predetermined angle, has come into practical use.

Further, an attempt to improve the resolution and a depth of focus by optimizing a polarization state of illumination light in accordance with an array direction of patterns on a reticle has been also proposed. This method is a method in which contrast of a transferred image and the like are improved by making a polarization direction of a linearly polarized illumination light be a direction orthogonal to a periodic direction of the patterns (a direction parallel to a longitudinal direction of the pattern) (e.g. Non-patent Document 1).

Also, as another method, in annular illumination, an attempt to improve the resolution, contrast of a projected image and the like by making a polarization direction of illumination light in an area where the illumination light is distributed within a pupil plane of an illumination optical system coincide with a circumferential direction of a circle having an optical axis as its center has been made (e.g. refer to Patent Document 1).

In this manner, in the case the resolution and contrast of a projected image and the like are improved by optimizing a polarization state of illumination light, it is preferable to confirm the polarization state of the illumination light. In this case, a method for measuring the polarization state of the illumination light on a plane conjugate with a pupil plane of an illumination optical system can be considered. However, in this method, various optical properties of the illumination optical system and a projection optical system such as a size, a shape and a position of illumination need to be measured, and therefore a proposal of a comprehensive measurement method is expected.

Further, in the case a polarization direction of illumination light is set so as to be different at different positions within the pupil plane of the illumination optical system, the propagating velocity of the illumination light is different depending on the polarization direction due to anisotropic nature of an optical element constituting a part of the projection optical system, and the like. Accordingly, even when the illumination light passes through the same projection optical system, a wavefront of the illumination light via the projection optical system is different depending on the polarization direction of the illumination light. Thus, since some of various optical properties of the illumination optical system and the projection optical system are not completely independent, a measurement method of optical properties in which these dependencies are taken into consideration is expected be offered.

Non-patent Document: Thimothy A. Brunner, et al.: "High NA Lithographic imaging at Brewster's angle", SPIE (USA) Vol. 4691, pp. 1-24 (2002)

Patent Document Kokai (Japanese Unexamined Patent Application Publication) No. 6-053120

DISCLOSURE OF INVENTION

Means for Solving the Problems

The present invention has been made in consideration of the situation described above, and according to a first aspect of the present invention, there is provided a first optical property measurement apparatus that measures optical properties of an optical system to be examined, the apparatus comprising: an incidence optical system on which a light via the optical system to be examined is incident; an optical unit that has a first optical system that converts the light incident on the incidence optical system into a first measurement light in order to measure a first optical property among the optical properties of the optical system to be examined, and a second optical system that converts the light incident on the incidence optical system into a second measurement light in order to measure a second optical property among the optical properties of the optical system to be examined; and a photodetector that receives the first measurement light or the second measurement light, or both.

With this apparatus, the first and second optical properties can be measured separately or in parallel from light-receiving results at the photodetector that receives the first measurement light or the second measurement light, or both. Further, since the common photodetector can be used to measure the first and second optical properties, the apparatus configuration can be reduced in size and weight.

According to a second aspect of the present invention, there is provided a second optical property measurement apparatus that measures optical properties of an optical system to be examined, the apparatus comprising: a polarization measurement instrument that measures a polarization state of a light via the optical system to be examined; and an optical property measurement instrument that measures at least one optical property among the optical properties of the optical system to be examined.

With this apparatus, the polarization state of the light via the optical system to be examined and at least one optical property out of the optical properties of the optical system to be examined can be measured.

According to a third aspect of the present invention, there is provided an exposure apparatus that projects an image of a predetermined pattern on a photosensitive object, the apparatus comprising: an illumination optical system that illuminates the predetermined pattern with an illumination light; a projection optical system that projects the illumination light via the predetermined pattern on the photosensitive object; a stage that comprises any one of the first and second optical property measurement apparatuses of the present invention; and an adjustment mechanism that adjusts an optical property of the illumination optical system or an optical system of the projection optical system, or both based on a measurement result of the optical property measurement apparatus.

Since this exposure apparatus comprises the adjustment mechanism that adjusts an optical property of the illumination optical system or the projection optical system, or both using a measurement result of any one of the first and second optical property measurement apparatuses, the optical property can be adjusted with good accuracy, and as a consequence, highly-accurate exposure can be achieved.

According to a fourth aspect of the present invention, there is provided an optical property measurement method in which optical properties of an optical system to be examined are measured, the method comprising: a first process in which a first optical property among the optical properties of the optical system to be examined is measured; a second process in which the first optical property of the optical system to be examined is adjusted based on a result of the measurement; and a third process in which a second optical property among the optical properties of the optical system to be examined is measured after the first optical property of the optical system to be examined is adjusted.

With this method, the first optical property of the optical system to be examined is measured in the first process, and after the first optical property is adjusted based on a result of the measurement in the second process, the second optical property that changes in accordance with the first optical property is measured in the third process. In this manner, even when the second optical property is dependent on the first optical property, the second optical property can be measured with good accuracy after the adjustment of the first optical property.

According to a fifth aspect of the present invention, there is provided an exposure method, comprising: a measurement process in which an illumination optical system that illuminates a predetermined pattern with an illumination light or a projection optical system that projects the illumination light via the predetermined pattern on a photosensitive object, or both is/are made to be an optical system to be examined, and an optical property of the illumination optical system or the projection optical system, or both is/are measured using the optical property measurement method of the present invention; an adjustment process in which the optical property of the illumination optical system or the projection optical system, or both is/are adjusted using a result of the measurement; and an exposure process in which the photosensitive object is exposed with an image of the predetermined pattern, after the adjustment.

With this method, after an optical property of at least one of the illumination optical system and the projection optical system is measured using the optical property measurement method of the present invention and the optical property of at least one of the illumination optical system and the projection optical system is adjusted using a result of the measurement, the photosensitive object is exposed with an image of a predetermined pattern, and therefore, exposure with high accuracy can be achieved.

Further, in a lithography process, a fine pattern can be formed on a photosensitive object with good accuracy by forming the pattern on the photosensitive object in the exposure method of the present invention, which makes it possible to manufacture microdevices with higher integration with good yield. Accordingly, it can also be said from another aspect that the present invention is a device manufacturing method in which the exposure method of the present invention is used.

BEST MODE FOR CARRYING OUT THE INVENTION

An embodiment of the present invention will be described below, referring to FIGS. 1 to 16.

Figure 1:
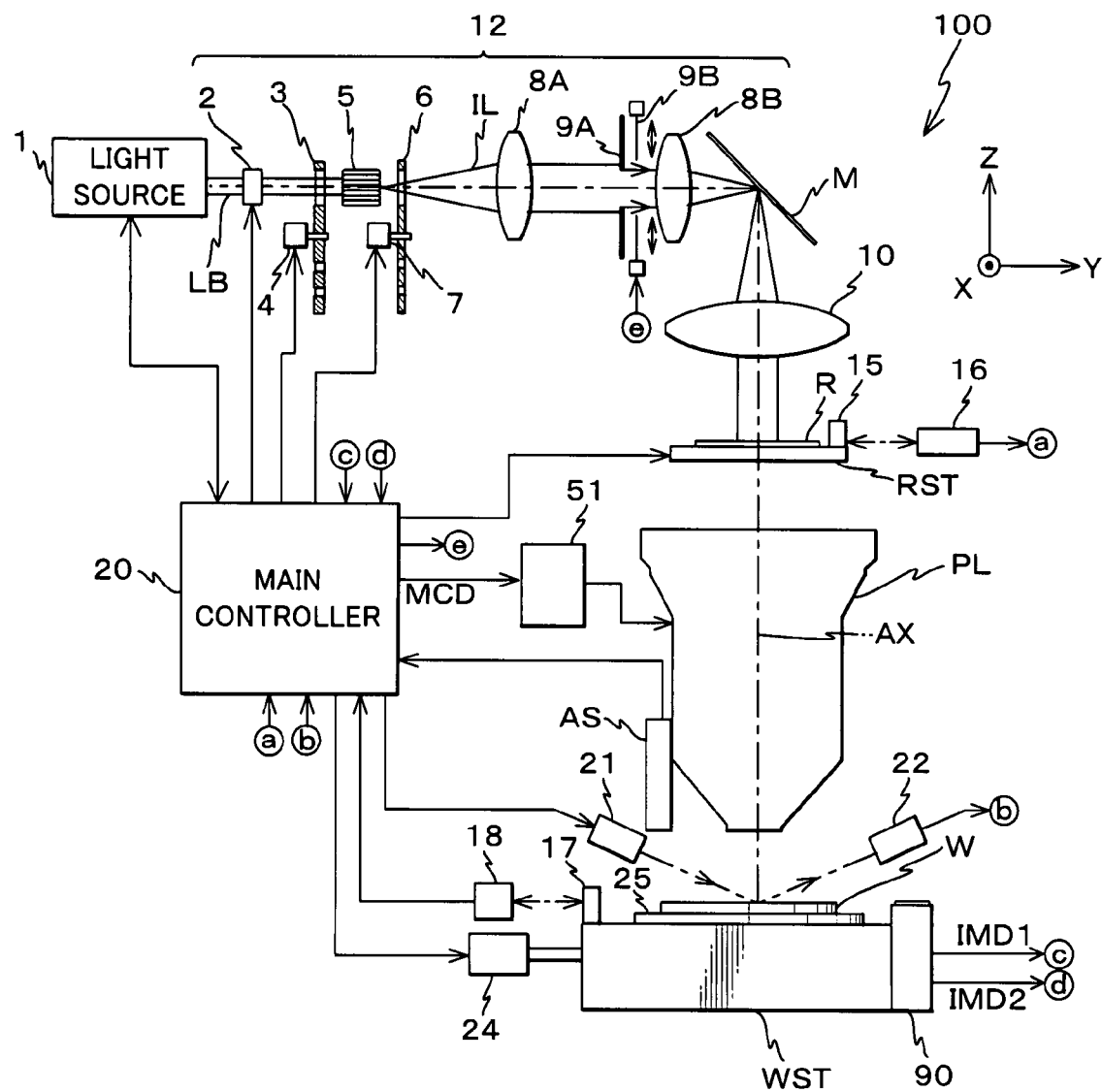
FIG. 1 is a view showing a schematic configuration of an exposure apparatus 100 in an embodiment of the present invention.

FIG. 1 schematically shows the entire configuration of an exposure apparatus 100 that is suitable for carrying out an optical property measurement method related to the embodiment of the present invention. Exposure apparatus 100 is a projection exposure apparatus by a step-and-scan method (a scanning stepper (which is also called a scanner)).

As is shown in FIG. 1, exposure apparatus 100 is equipped with an illumination system that includes a light source 1 and an illumination optical system 12, a reticle stage RST that holds a reticle R; a projection optical system PL, a wafer stage WST on which a wafer W is mounted, a main controller 20 that has overall control over the entire apparatus, and the like.

As light source 1, in this case, an ArF (argon fluoride) excimer laser light source (output wavelength: 193 nm) is used. At light source 1, a laser beam (an illumination light) having a linearly polarized light as a main component is generated by narrowing bandwidth or selecting a wavelength, or both, and is output.

In actual, light source 1 is arranged in a service room having a lower degree of cleanliness, which is separate from a clean room where a chamber (not shown) in which illumination optical system 12, reticle stage RST, projection optical system PL, wafer stage WST, and the like are housed. Light source 1 is connected to the chamber via a light transmitting optical system (not shown), which includes at least an optical system for optical axis adjustment called a beam matching unit (BMU) in a part of its system. Light source 1 controls the on/off of the output of laser beam LB, the energy of laser beam LB per pulse, the oscillation frequency (the repetition frequency), the center wavelength and the spectral line half width, and the like by an internal controller, based on control information from main controller 20.

Illumination optical system 12 comprises a cylinder lens, a beam expander, a polarization control unit 2, a zoom optical system, a diffraction optical element unit, a polarization conversion unit 3, and an optical integrator (homogenizer) 5, an illumination system aperture stop plate 6, a first relay lens 8A, a second relay lens 8B, a fixed reticle blind 9A and a movable reticle blind 9B, an optical path deflecting mirror M, a condenser lens 10, and the like. Of these components, the cylinder lens, the beam expander, the zoom optical system and the diffraction optical element unit are omitted in FIG. 1. In this case, as optical integrator 5, a fly-eye lens, an internal reflection type integrator (a rod integrator or the like), a diffractive optical element or the like can be used. In the embodiment, a fly-eye lens is used, therefore, hereinafter it will also be referred to as 'fly-eye lens 5'.

Illumination optical system 12 is connected to the light transmitting optical system described above via a light transmitting window (not shown). A sectional shape of laser beam LB, which is the pulsed light that is emitted from light source 1 and is incident via the light transmitting window, is shaped using, for example, the cylinder lens or the beam expander.

Polarization control unit 2 is equipped with a half wave plate that is rotatable around a rotation axis that coincides with, for example, an optical axis of illumination optical system 12 (which is to coincide with an optical axis AX of the projection optical system). When laser beam LB shaped as described above enters the half wave plate, the polarization direction of the laser beam changes because a phase of a component in a phase advance axis direction advances a half wavelength with respect to a phase of a component in a direction orthogonal to the phase advance axis direction. Since the change is determined by a rotation position of each of a polarization direction of incident laser beam LB and the phase advance axis of the half wave plate, polarization control unit 2 can control the polarization direction of emitted laser beam LB by adjusting the rotation position of the half wave plate. The adjustment of the rotation position of the half wave plate is performed by driving of a drive unit (not shown) under instructions of main controller 20.

Incidentally, in the case laser beam LB emitted from light source 1 is an elliptically polarized light, polarization control unit 2 may also be equipped with a quarter wave plate that is rotatable around a rotation axis that coincides with optical axis AX of illumination optical system 12, in addition to the half wave plate. In this case, the elliptically polarized laser beam is converted into a linearly polarized light by the quarter wave plate, and then the polarization direction thereof is adjusted by the half wave plate. Further, at polarization control unit 2, an element that removes the polarized nature of laser beam LB can be placed on an optical path of laser beam LB so as to be capable of being inserted to and withdrawn from the optical path. With the element, in exposure apparatus 100, random polarized illumination also becomes possible when illuminating reticle R.

Laser beam LB which polarization direction is adjusted at polarization control unit 2 passes though the zoom optical system (not shown) made up the combination of a concave lens and a convex lens, and then enters the diffraction optical element unit (not shown). In the diffraction optical element unit, a plurality of phase-type diffractive optical elements through which diffraction angles and directions of diffracted lights are different from one another are arrayed on a turret-like member. Any one of the plurality of diffractive optical elements is selectively placed on the optical path of the laser beam under instructions of main controller 20. By switching a diffractive optical element to be placed on the optical path of laser beam LB, the sectional shape of laser beam LB can be a desired shape. Normally, from the viewpoint of energy efficiency, a diffractive optical element to be placed on the optical path is determined in accordance with the shape of the stop that is selected at illumination system aperture stop plate 6 (to be described later). In this manner, most part of laser beam LB is condensed to an opening section of illumination system aperture stop plate 6, which is advantageous from the point of energy efficiency.

Figure 2:
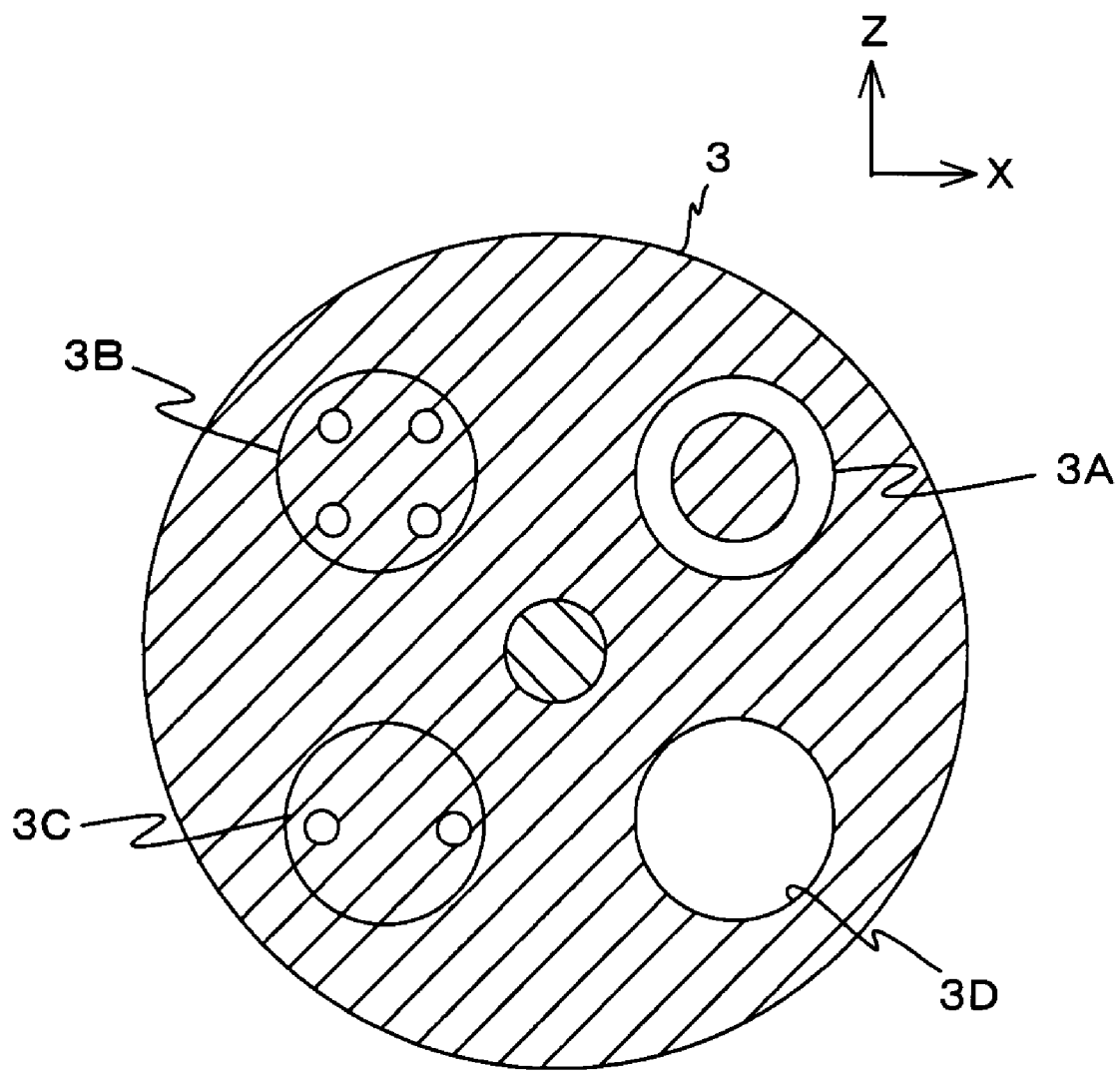
FIG. 2 is a planar view of a polarization conversion unit.

Laser beam LB which sectional shape is defined by a diffractive optical element placed on the optical path enters polarization conversion unit 3. FIG. 2 shows a planar view of polarization conversion unit 3. As is shown in FIG. 2, in polarization conversion unit 3, polarization conversion members 3A and 3B, an opening member 3C and opening section 3D are placed substantially equiangularly. In FIG. 2, a light-shielding section is indicated by diagonal lines. Polarization conversion unit 3 is rotated by driving of a drive unit 4 such as a motor that is controlled by a control signal from main controller 20, and polarization conversion members 3A or 3B, opening member 3C or opening section 3D is selectively placed on the optical path of laser beam LB. Which of polarization conversion members 3A and 3B, opening member 3C and opening section 3D is to be placed on the optical path is determined in accordance with the stop of the illumination system aperture stop plate (to be described later) that is placed on the optical path.

Figure 3A:
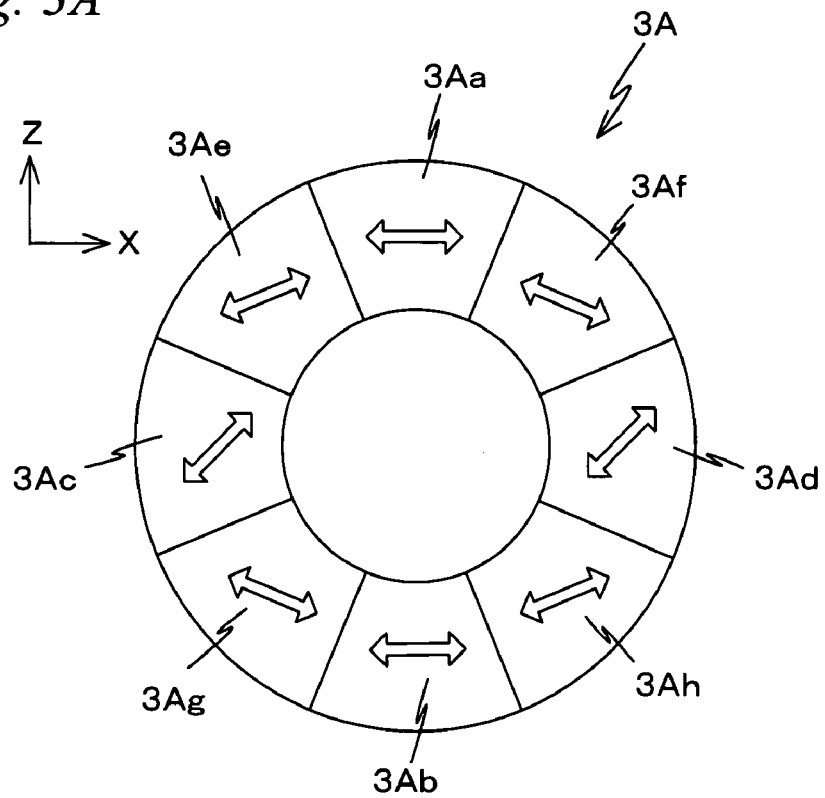
FIG. 3A is a view showing a datum direction in a polarization conversion member with annular illumination.
Figure 3B:
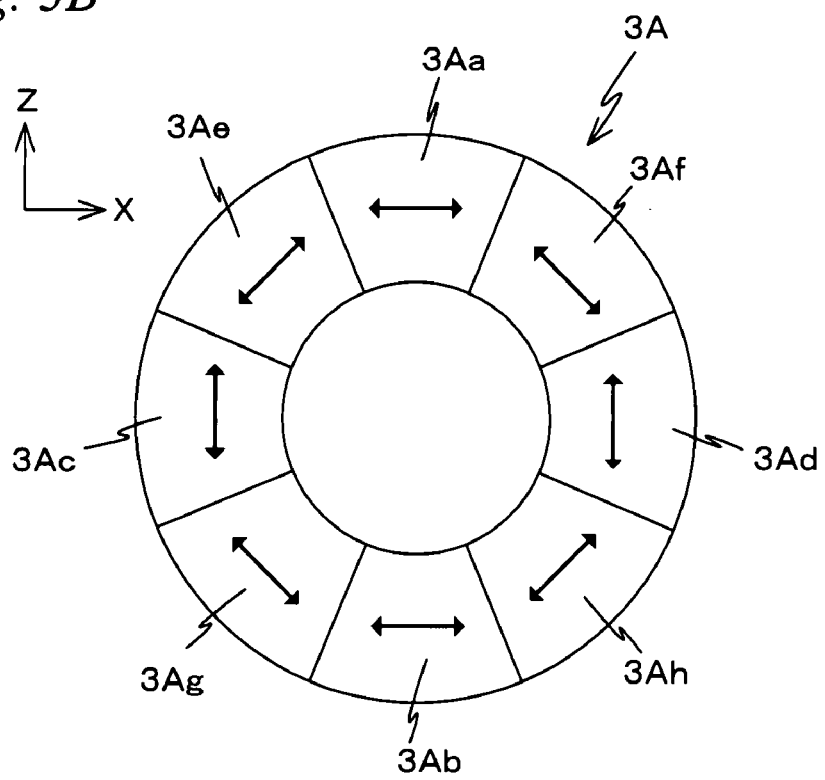
FIG. 3B is a view showing a polarization direction of a light converted by the polarization conversion member with annular illumination.

FIGS. 3A and 3B show an example of polarization conversion member 3A arranged in polarization conversion unit 3. Polarization conversion member 3A is a member that is placed on the optical path of laser beam LB under instructions of main controller 20 when an annular (ring-shaped) illumination aperture stop (to be described later) of illumination system aperture stop plate 6 (to be described later) is placed on the optical path. Polarization conversion member 3A is made up of half wave plates 3Aa, 3Ab, 3Ac, 3Ad, 3Ae, 3Af, 3Ag and 3Ah made of birefringent materials such as a uniaxial crystal. As is shown in FIG. 3A, these half wave plates are placed adjacent to one another around optical axis AX of illumination optical system 12 as the center. Half wave plates 3Aa to 3Ah are held by a holding member that is placed outside the optical path of laser beam LB.

At half wave plates 3Aa to 3Ah, a direction, which makes a phase of a linearly polarized light parallel to the direction be shifted by a half wavelength with respect to a phase of a linearly polarized light perpendicular to the direction, is to be a 'datum direction'. In FIG. 3A, the datum directions are indicated by outline arrows. As is shown in FIG. 3A, at half wave plates 3Aa to 3Ah, each datum direction is in a different direction. Here, laser beam LB is assumed to be a linearly polarized light that has a polarization direction in an X-axis direction (which is referred to as an 'H polarized light'). In this case, the polarization direction of laser beam LB that is converted by half wave plates 3Aa to 3Ah becomes the direction as shown in FIG. 3B. In other words, the polarization direction of laser beam LB is converted by polarization conversion member 3A into a circumferential direction (a tangent line direction) of a circle having optical axis AX as the center.

Figure 4A:
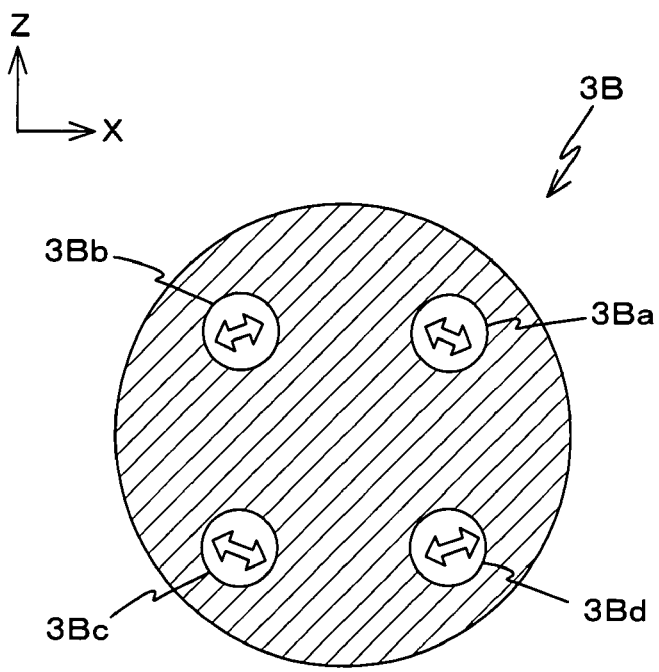
FIG. 4A is a view showing a datum direction in a polarization conversion member with quadrupole illumination.
Figure 4B:
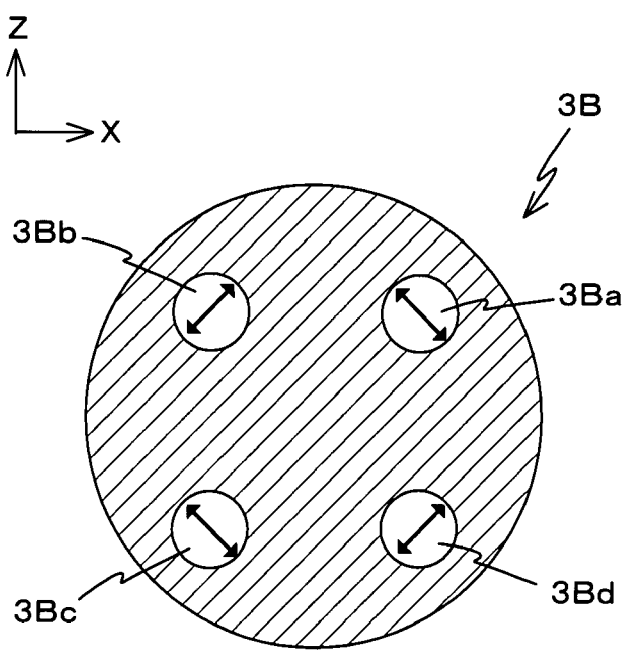
FIG. 4B is a view showing a polarization direction of a light converted by the polarization conversion member with quadrupole illumination.

FIGS. 4A and 4B show polarization conversion member 3B arranged on polarization conversion unit 3. Polarization conversion member 3B is placed on the optical path under instructions of main controller 20 when a quadrupole illumination aperture stop of illumination system aperture stop plate 6 (to be described later) is placed on the optical path. Polarization conversion member 3B is equipped with half wave plates 3Ba, 3Bb, 3Bc and 3Bd made of birefringent materials such as a uniaxial crystal. As is shown in FIG. 4A, these half wave plates are placed at predetermined spacing around optical axis AX of illumination optical system 12 as the center. Half wave plates 3Ba to 3Bd are held by a light-shielding member that is indicated by diagonal lines.

FIG. 4A shows datum directions at half wave plates 3Ba to 3Bd. In this case, when laser beam LB is assumed to be the H polarized light (a linearly polarized light which polarization direction is the X-axis direction), a polarization direction of laser beam LB that is converted by half wave plates 3Ba to 3Bd becomes the direction as shown in FIG. 4B. In other words, the polarization direction of laser beam LB is converted by polarization conversion member 3B so as to be a circumferential direction (a tangent line direction) of a circle having optical axis AX as the center.

Referring back to FIG. 2, opening member 3C has two opening portions that correspond to a bipolar illumination aperture stop (to be described later) of illumination system aperture stop plate 6 (to be described later), and opening member 3C is placed on the optical path of laser beam LB under instructions of main controller 20 in the case the bipolar illumination aperture stop is placed on the optical path of illumination light IL. Further, opening section 3D has a relatively large circular opening portion that corresponds to a conventional illumination aperture stop (to be described later) of illumination system aperture stop plate 6 (to be described later), and opening section 3D is placed on the optical path of laser beam LB under instructions of main controller 20 in the case the conventional illumination aperture stop is placed on the optical path of illumination light IL.

Referring back to FIG. 1, laser beam LB emitted from polarization conversion unit 3 enters fly-eye lens 5. In order to illuminate reticle R with a uniform illuminance distribution, due to incident laser beam LB, fly-eye lens 5 forms a surface light source that is made up of multiple point light sources (light source images) on a focusing plane on an exit side of fly-eye lens 5 (which substantially coincides with a pupil plane of illumination optical system 12). Hereinafter, a laser beam that is emitted from this secondary light source will be referred to as 'Illumination light IL'.

Figure 5:
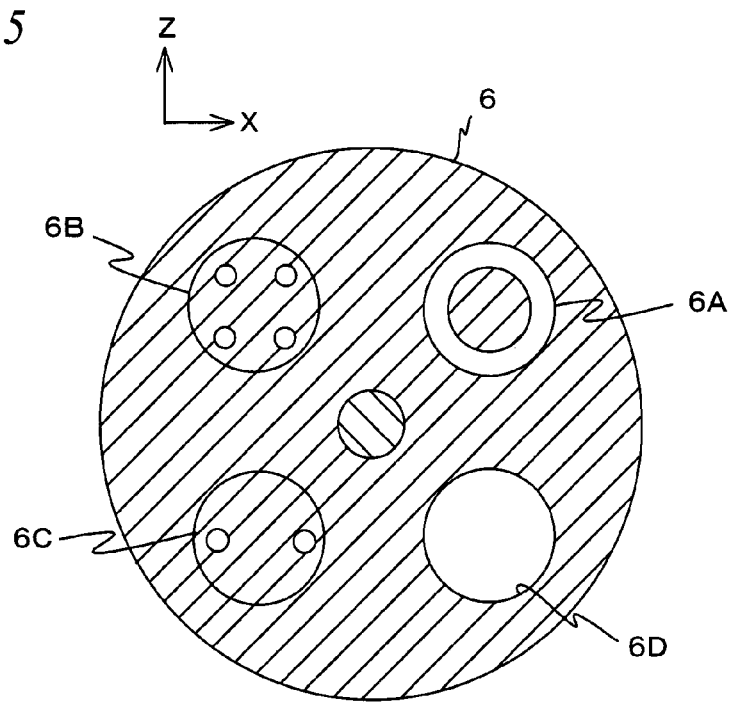
FIG. 5 is a planar view of an illumination system aperture stop plate.

In the vicinity of the focusing plane on the exit side of fly-eye lens 5, illumination system aperture stop plate 6 constituted by a discoid-shaped member is placed. As is shown in FIG. 5, on illumination system aperture stop plate 6, for example, an annular aperture stop for annular illumination (an annular illumination aperture stop 6A), and a modified aperture stop for modified illumination composed of a plurality of openings disposed in an eccentric arrangement (a quadrupole illumination aperture stop 6B, and bipolar illumination aperture stop 6C), an aperture stop composed of a conventional circular opening (a conventional illumination aperture stop 6D) and the like are placed substantially equiangularly.

Illumination system aperture stop plate 6 is rotated by driving of drive unit 7 such as a motor that is controlled by a control signal from main controller 20 shown in FIG. 1, and any one of the aperture stops is selectively set on the optical path of illumination light IL, so that the shape and size of the secondary light source (the light quantity distribution of illumination light) on the pupil plane is limited to a ring, a large circle, four eyes or the like. Incidentally, in the embodiment, using illumination system aperture stop plate 6, the light quantity distribution of illumination light IL on the pupil plane of illumination optical system 12 (the shape and size of the secondary light source) is changed, that is, an illumination condition of reticle R is changed. It is preferable, however, to suppress light quantity loss due to the change of the illumination condition to the minimum by making intensity distribution of illumination light or an incident angle of the illumination light on the incident plane of optical integrator (fly-eye lens) 5 variable. Therefore, instead of, or combined with illumination system aperture stop plate 6, for example, a configuration can be employed in which an optical unit that includes at least one of a plurality of diffractive optical elements placed switchable on the optical path of illumination optical system 12, at least one prism (such as a cone prism or a polyhedral prism) movable along an optical axis of illumination optical system 12, and a zoom optical system is placed between light source 1 and optical integrator (fly-eye lens) 5.

Referring back to FIG. 1, on the optical path of illumination light IL outgoing from illumination system aperture stop plate 6, a relay optical system composed of a first relay lens 8A and a second relay lens 8B is placed, with a fixed reticle blind 9A and a movable reticle blind 9B disposed in between.

Fixed reticle blind 9A is placed on a plane slightly defocused from a plane conjugate with the pattern surface of reticle R, and a rectangular opening is formed thereon that defines an illumination area on reticle R. In addition, in the vicinity of fixed reticle blind 9A (a plane conjugate with the pattern surface of reticle R), movable reticle blind 9B is placed having an opening portion which position and width are variable in directions respectively corresponding to a scanning direction (a Y-axis direction in this case) and a non-scanning direction (an X-axis direction). When scanning exposure starts and ends, exposure on an unnecessary part is prevented by further restricting the illumination area on reticle R via movable reticle blind 9B by control of main controller 20.

On the optical path of illumination light IL in the rear of second relay lens 8B constituting the relay optical system, deflecting mirror M is placed that reflects illumination light IL that has passed through second relay lens 8B towards reticle R, and in the rear of mirror M on the optical path of illumination light IL, condenser lens 10 is placed.

In the configuration described so far, the incident surface of fly-eye lens 5, the plane on which movable reticle blind 9B is placed, and the pattern surface of reticle R are set optically conjugate with one another, while the diffractive optical element of the diffraction optical element unit (not shown), the polarization conversion member of polarization conversion unit 3, the focusing plane on the exit side of fly-eye lens 5 (the pupil plane of illumination optical system 12) and the pupil plane of projection optical system PL are set optically conjugate with one another. Further, the pattern surface of reticle R and the pupil plane of projection optical system PL have a relation of the Fourier transform.

The operation of illumination optical system 12 having such a configuration will now be briefly described. Laser beam LB, which is the pulsed light emitted from light source 1 enters fly-eye lens 5 while the sectional shape of the beam is shaped, in a state where the polarization direction within the section is defined to a desired direction by polarization control unit 2 and polarization conversion unit 3. With this operation, the secondary light source described previously is formed on the focusing plane on the exit side of fly-eye lens 5.

Illumination light IL emitted from the secondary light source described above passes through any one of the aperture stops on illumination system aperture stop plate 6, and then passes through the rectangular opening of fixed reticle blind 9A and movable reticle blind 9B via first relay lens 8A. Then, illumination light IL passes through second relay lens 8B and the optical path of illumination light IL is deflected perpendicularly downward by mirror M, and then illumination light IL illuminates the rectangular illumination area on reticle R held on reticle stage RST with a uniform illuminance distribution via condenser lens 10.

On reticle stage RST, reticle R is fixed by, for example, vacuum suction. In this case, reticle stage RST is finely drivable within an XY plane perpendicular to optical axis AX of projection optical system PL by a reticle drive system (not shown) made up of a linear motor or the like and is also drivable at a designated scanning velocity in a predetermined scanning direction (the Y-axis direction).

The position of reticle stage RST within a stage-moving plane is constantly detected at a resolution of, for example, around 0.5 to 1 nm with a reticle laser interferometer (hereinafter referred to as a 'reticle interferometer') 16 via a movable mirror 15. Position information (or velocity information) of reticle stage RST from reticle interferometer 16 is sent to main controller 20, and main controller 20 moves reticle stage RST via reticle stage drive system (drawing omitted) based on the position information (or velocity information).

Projection optical system PL is placed below reticle stage RST in FIG. 1, and the direction of optical axis AX of projection optical system PL is a Z-axis direction. Projection optical system PL is, for example, a both-side telecentric reduction system, and includes a plurality of lens elements (not shown) having optical axis AX in the Z-axis direction in common. Further, as projection optical system PL, a projection optical system that has the projection magnification β of, for example, ¼, ⅕, ⅙ or the like is used. Therefore, when the illumination area on reticle R is illuminated with illumination light (exposure light) IL as is described above, a pattern formed on reticle R is projected on a slit-shaped exposure area on wafer W which surface is coated with resist (photosensitive agent), as an image (partially inverted image) reduced by projection magnification β by projection optical system PL.

Incidentally, in the embodiment, of the plurality of lens elements described above, specific lens elements (for example, predetermined five lens elements) are individually movable. Such movement of specific lens elements is performed by drive elements such as three piezo elements arranged per each specific lens element. That is, by separately driving these drive elements, the specific lens elements can individually be moved in parallel along optical axis AX in accordance with a displacement amount of each drive element, and a desired tilt with respect to a plane perpendicular to optical axis AX can be added to the specific lens elements individually. In the embodiment, a drive instruction signal used to drive the drive elements described above is output by an image-forming characteristic correction controller 51 based on instructions from main controller 20, and the displacement amount of each drive element is controlled according to the drive instruction signal.

In projection optical system PL having the configuration described above, movement control of the lens elements by main controller 20 via image-forming characteristic correction controller 51 makes it possible to adjust various aberrations (one of optical properties) such as distortion, curvature of field, astigmatism, comma, spherical aberration and the like.

Wafer stage WST is placed on a base (not shown) below projection optical system PL in FIG. 1, and on the upper surface of wafer stage WST, wafer holder 25 is mounted. On wafer holder 25, wafer W is fixed, for example, by vacuum suction or the like.

Wafer stage WST is driven in a scanning direction (the Y-axis direction) and a non-scanning direction (the X-axis direction) perpendicular to the scanning direction by wafer stage drive system 24 including a motor or the like. With wafer stage WST, a step-and-scan operation is carried out in which an operation for relatively scanning wafer W to reticle R to perform scanning exposure of each shot area on wafer W and an operation for moving wafer W to a scanning starting position (acceleration starting position) for exposure of the next shot are repeated.

The position of wafer stage WST within the XY plane is constantly detected with a resolution of, for example, around 0.5 to 1 nm by a wafer laser interferometer (hereinafter referred to as a 'wafer interferometer') 18 via movable mirror 17. Position information (or velocity information) of wafer stage WST is sent to main controller 20, and main controller 20 performs drive control of wafer stage WST via wafer stage drive system 24 based on the position information (or velocity information).

Further, wafer stage WST is finely driven also in the Z-axis direction, a θx direction (a rotation direction around the X-axis: pitching direction), a θy direction (a rotation direction around the Y-axis: rolling direction), and a θz direction (a rotation direction around the Z-axis: yawing direction). In addition, on a +Y side of wafer stage WST, optical property measurement apparatus 90 (to be described later) is arranged.

An alignment detection system AS is placed on the side surface of projection optical system PL. In the embodiment, an image-forming alignment sensor that observes a street line or a position detection mark (a fine alignment mark) formed on wafer W is used as alignment detection system AS. The detailed configuration of alignment detection system AS is disclosed in, for example, Kokai (Japanese Unexamined Patent Application Publication) No. 9-219354, and the corresponding U.S. Pat. No. 5,859,707, and the like. The observation results by alignment detection system AS are supplied to main controller 20. As long as the national laws in designated states (or elected states), to which this international application is applied, permit, the above disclosures of the publication and the U.S. patent are incorporated herein by reference.

Further, in exposure apparatus 100 in FIG. 1, a multipoint focal position detection system (21, 22) is arranged that is one of focus detection systems (focal point detection systems) by an oblique incident method is arranged and used for detecting the position in the Z-axis direction (an optical axis AX direction) within the exposure area and the areas in the vicinity of the exposure area on the surface of wafer W. The detailed configuration of the multipoint focal position detection system (21, 22) and the like are disclosed in, for example, Kokai (Japanese Unexamined Patent Application Publication) No. 6-283403, and the corresponding U.S. Pat. No. 5,448,332, and the like. The detection results by the multipoint focal position detection system (21, 22) are supplied to main controller 20. As long as the national laws in designated states (or elected states), to which this international application is applied, permit, the above disclosures of the publication and the U.S. patent are incorporated herein by reference.

Figure 6:
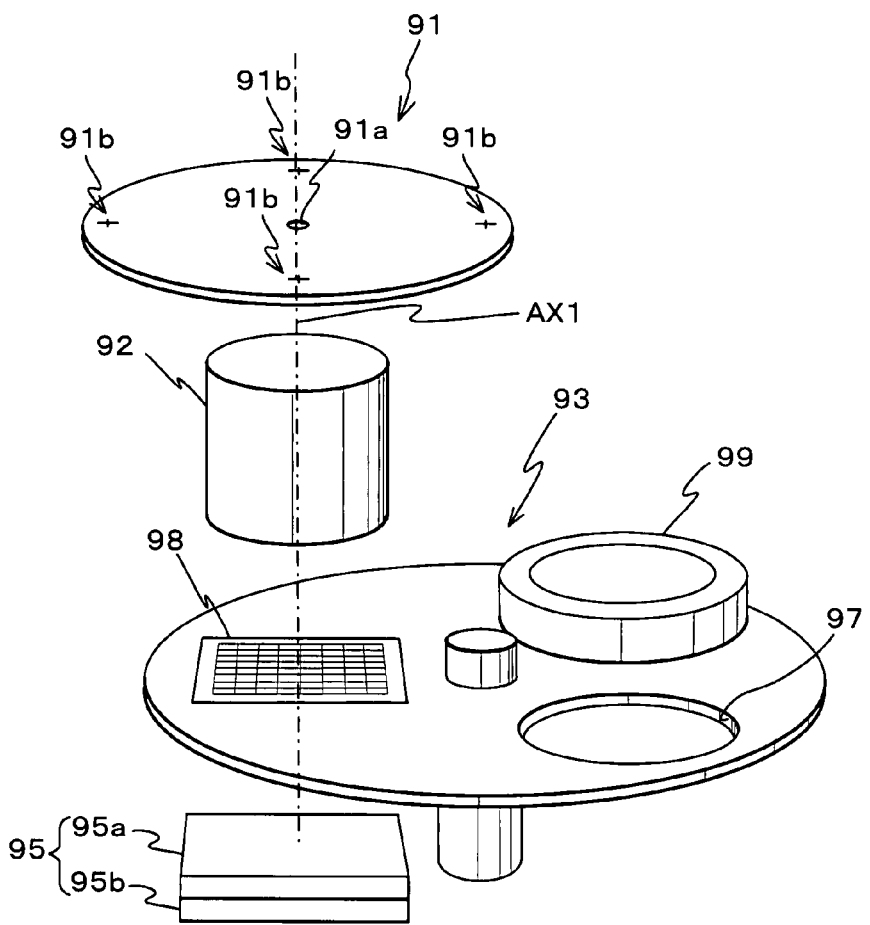
FIG. 6 is a view showing a configuration of an optical property measurement apparatus.

Next, optical property measurement apparatus 90 arranged at wafer stage WST will be described. FIG. 6 shows a model of components that are placed on the upper surface or the inside of a housing of optical property measurement apparatus 90 shown in FIG. 1. As is shown in FIG. 6, optical property measurement apparatus 90 is equipped with a marking plate 91, a collimator optical system 92, an optical system unit 93 and a photodetector 95.

Marking plate 91 is placed at a height position (a Z-axis direction position) that is the same as the surface of wafer W held on wafer stage WST so as to be orthogonal to optical axis AX (refer to FIG. 1). On the surface of marking plate 91, a light-shielding film also serving as a reflection film is formed by vapor deposition of metal such as chromium, and a circular opening 91a is formed in a center portion of the light shielding film. The light shielding film can shield unnecessary light from entering collimator optical system 92 when wavefront aberration of projection optical system PL is measured. In addition, on the periphery of opening 91a of the light-shielding film, three or more pairs (4 pairs in FIG. 6) of two-dimensional position detection mark 91b are formed, of which a position relation with opening 91a is known in design. As two-dimensional position detection mark 91b, in the embodiment, a cross mark is employed. The cross mark can be detected by alignment detection system AS.

Collimator optical system 92 is placed below marking plate 91. Illumination light IL via opening 91a of marking plate 91 is converted into parallel beams in a vertical downward direction by collimator optical system 92.

On optical system unit 93, an opening section 97, a microlens array 98 and a polarization detection system 99 are placed spaced apart at a predetermined equal angle around a predetermined rotation axis. By the rotation of the rotation axis, opening section 97, microlens array 98 or polarization detection system 99 can be placed selectively on an optical path (a position corresponding to an optical axis AX1) of the light via collimator optical system 92. The rotation of the rotation axis is performed by a drive unit (not shown) under instructions of main controller 20.

Opening section 97 makes the parallel beams emitted from collimator optical system 92 pass through directly. By placing opening section 97 on the optical path of illumination light IL, photodetector 95 can measure a pupil image. In this case, the pupil image indicates a light source image formed on a pupil plane of projection optical system PL by the light incident on projection optical system PL via a pinhole pattern (to be described later). Incidentally, opening section 97 may be equipped with a transmitting member that directly transmits the parallel beams.

Microlens array 98 is configured of a plurality of small lenses (microlenses) that are disposed in an array arrangement within a plane orthogonal to the optical path. To be more specific, microlens array 98 is an array in which multiple square-shaped microlenses having equal side lengths are densely arrayed in a matrix arrangement. Incidentally, microlens array 98 is produced by performing etching processing to a plane-parallel glass plate. At microlens array 98, each microlens emits an image-forming beam of an image via a pinhole pattern (to be described later) formed at opening 91a of marking plate 91.

Figure 7:
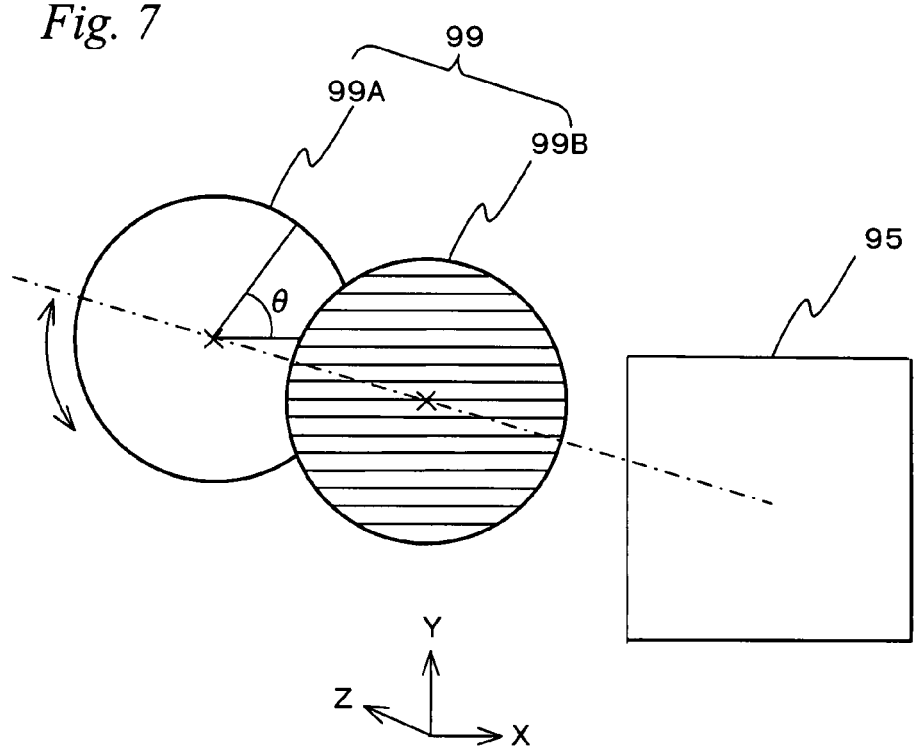
FIG. 7 is a view showing a configuration of a polarization detection system.

FIG. 7 shows a model of an optical configuration of polarization detection system 99. As is shown in FIG. 7, polarization detection system 99 is equipped with a quarter wave plate 99A and a polarization beam splitter 99B. Incidentally, polarization beam splitter 99B is originally used to branch a beam into two beams in accordance with a polarization direction. However, in this case, polarization beam splitter 99B operates to make only a polarization component in a specific direction pass through, and therefore FIG. 7 shows such an operation. In FIG. 7, quarter wave plate 99A and polarization beam splitter 99B are arranged rotatable around collinear rotation axes. Their rotation positions can be controlled by driving of a drive unit (not shown) under instructions of main controller 20. Accordingly, relative rotation positions of quarter wave plate 99A and polarization beam splitter 99B can be adjusted by main controller 20. The parallel beams emitted from collimator optical system 92 pass through quarter wave plate 99A and polarization beam splitter 99B.

Photodetector 95 is configured of a light-receiving element (hereinafter referred to as a 'CCD') 95a made up of a two-dimensional CCD or the like, an electric circuit 95b such as charge-transfer control circuit, and the like. CCD 95a has an area large enough for receiving all beams that enter collimator optical system 92 and are emitted from microlens array 98. Further, CCD 95a has a light-receiving surface on a plane, which is an image-forming plane on which an image of the pinhole pattern (to be described later) formed at opening 91a is formed again by each microlens of microlens array 98, and is optically conjugate with the formation plane of opening 91a. In addition, the light-receiving surface is located on a plane slightly deviated from a plane conjugate with a pupil plane of projection optical system PL, when opening section 97 is placed on the optical path described above.

Main controller 20 includes the so-called microcomputer (or workstation) that is constituted by a CPU (Central Processing Unit), an internal memory such as ROM (Read Only Memory) and RAM (Random Access Memory), and the like, and the overall control of exposure apparatus 100 is realized by the CPU executing the program loaded on the internal memory (RAM).

Figure 8:
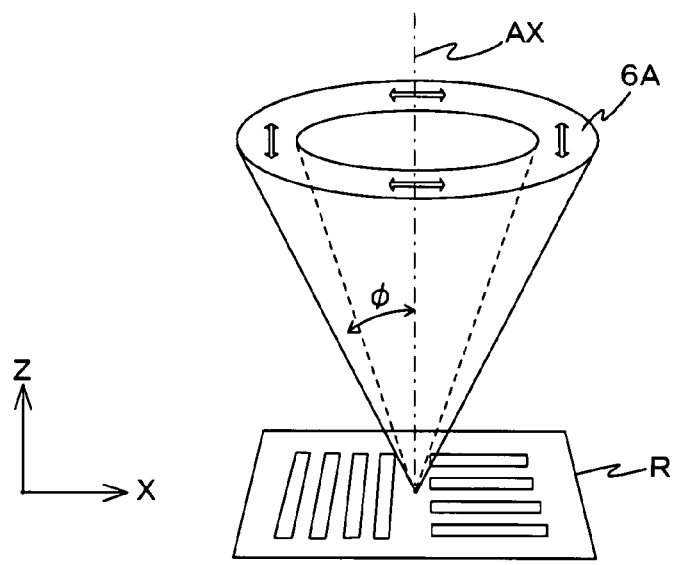
FIG. 8 is a view used to explain a principle of polarized illumination.

The principle of polarized illumination that can be used in exposure apparatus 100 will be briefly described next, referring to FIG. 8. FIG. 8 shows a model of a relation between a pupil plane of illumination optical system 12 and reticle R. Other components of illumination optical system 12 are omitted in the drawing. Further, a line-and-space pattern (hereinafter referred to as an 'L/S pattern') having periodicity in the X-axis direction and an L/S pattern having periodicity in the Y-axis direction are assumed to be formed on reticle R.

FIG. 8 shows a state where annular illumination aperture stop 6A of illumination system aperture stop plate 6 is placed on the optical path of illumination light IL under instructions of main controller 20. Further, it is assumed that polarization control unit 2 sets a polarization direction of laser beam LB as the H polarized light (a polarized light having a polarization direction in the X-aids direction) and polarization conversion member 3A of polarization conversion unit 3 is placed on the optical path of laser beam LB. With this arrangement, the polarization direction of illumination light IL that passes through annular illumination aperture stop 6A is defined so as to be a circumferential direction of a circle having optical axis AX as the center, as is shown in FIG. 8. Thus, illumination light IL enters reticle R at a predetermined angle inclined from an incident angle φ as the center. The value of sine of the incident angle φ is proportional to a distance from optical axis AX of illumination optical system 12 to the center position of an annular opening section (hereinafter referred to as an 'annular area').

In the case illumination light IL is a linearly polarized light that is roughly parallel to a circumferential direction of the annular area on the pupil plane of the illumination optical system, illumination light IL becomes an S polarized light with respect to reticle R as is shown in FIG. 8. The S polarized light in this case has the same meaning as the S polarized light generally defined in the optics, and indicates a polarized light which polarization direction is perpendicular to a plane including a propagating direction of illumination light IL and a normal line with respect to reticle R. When reticle R is illuminated with such an incident orientation (incident angle φ and the polarization state), it becomes possible to improve contrast and the like of an image of the L/S pattern projected via projection optical system PL. Incidentally, the reason is disclosed in Kokai (Japanese Unexamined Patent Application Publication) No. 06-053120, the Pamphlet of International Publication No. WO 2004/051717, the corresponding U.S. patent application Ser. No. 11/140,103 and the like. As long as the national laws in designated states (or elected states), to which this international application is applied, permit, the above disclosures of the publication, the Pamphlet, and the U.S. patent application are incorporated herein by reference.

Further, in the embodiment, also in the case quadrupole illumination aperture stop 6B of illumination system aperture stop plate 6 and polarization conversion member 3B of polarization conversion unit 3 are placed on optical axis AX, since a polarization state of illumination light IL is a circumferential direction of a circle around optical axis AX as the center as is shown in FIG. 4B, the polarization state of illumination light IL can be the S polarization with respect to the surface of reticle R, which makes it possible to improve the contrast of a pattern image on an image plane.

Next, exposure operations of exposure apparatus 100 in the embodiment will be described according to flowcharts in FIGS. 9 to 12 that show simplified processing algorithms of main controller 20, while referring to other drawings when needed. Incidentally, in this case, the description will be made on the assumption that exposure of a first layer on wafer W has been already completed and exposure of second and subsequent layers will be performed. Incidentally, aberration of the optical systems inside optical property measurement apparatus 90 is to be small enough to be ignored.

Figure 9:
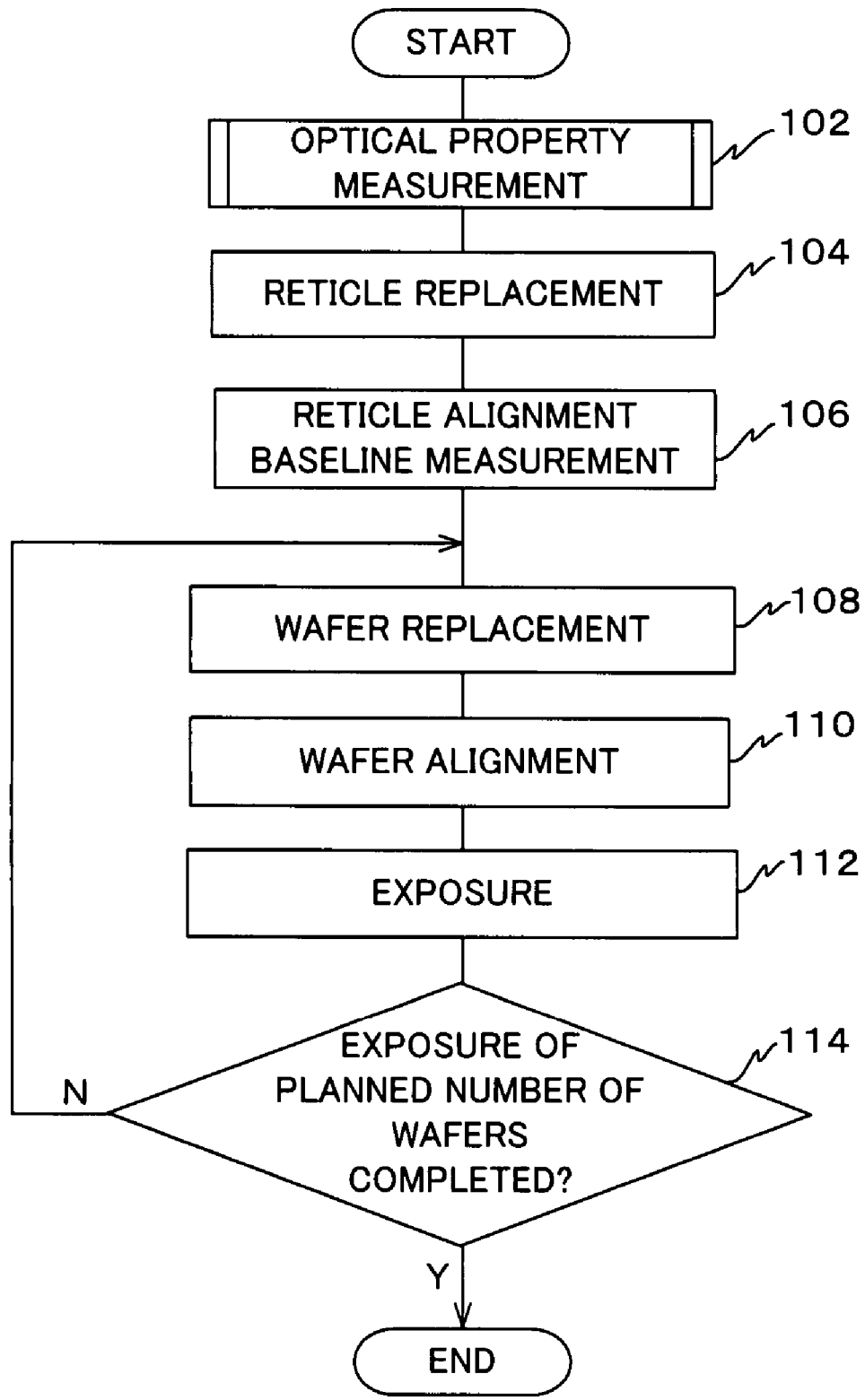
FIG. 9 is a flowchart showing processing of a main controller 20 when exposure operations are performed.
Figure 10:
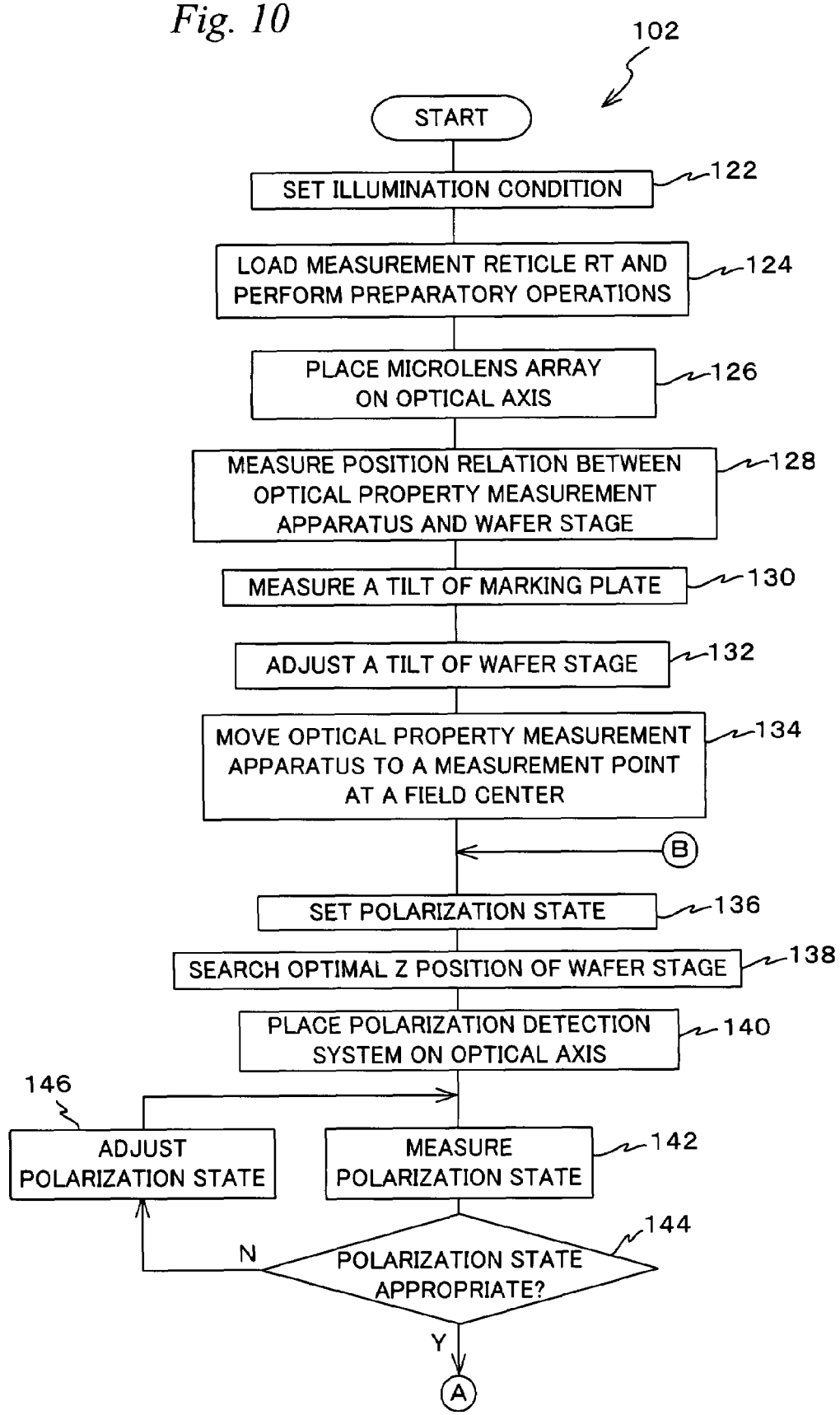
FIG. 10 is a flowchart (No. 1) showing measurement processing of an optical property.

As is shown in FIG. 9, first of all, in step 102, subroutine processing of optical property measurement is performed. In subroutine 102, first, in step 122 in FIG. 10, an illumination condition for performing optical property measurement is set. Specifically, main controller 20 sets the polarization of laser beam LB to the H polarization in polarization control unit 2, rotates illumination system aperture stop plate 6 by driving drive unit 7, and places conventional illumination aperture stop 6D on the optical path of illumination light IL. Also, main controller 20 rotates polarization conversion unit 3 by driving drive unit 4 and places opening section 3D on the optical path of laser beam LB. With this operation, illumination to reticle R by the conventional aperture stop can be made in exposure apparatus 100. In this case, a pupil image formed within a pupil plane of projection optical system PL has a circular shape.

Figure 13:
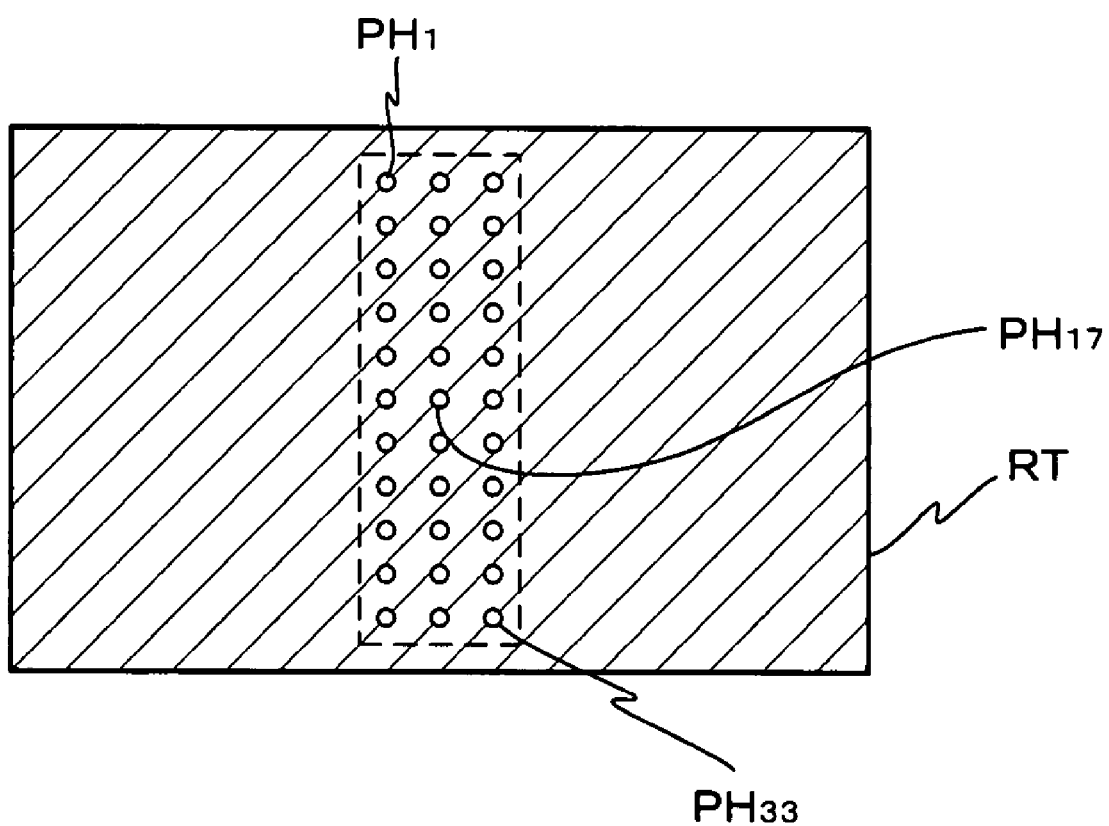
FIG. 13 is a view showing an example of a measurement reticle.

Next, in step 124, a measurement reticle RT shown in FIG. 13 is loaded on reticle stage RST using a reticle loader (not shown), and also predetermined preparatory operations are performed.

On measurement reticle RT, as is shown in FIG. 13, a plurality of pinhole patterns (in FIG. 13, 3×11=33 of pinhole patterns $PH_n$ (n=1 to 33)) are arranged in a matrix arrangement having a row direction and a column direction in the X-axis direction and in the Y-axis direction respectively, in a state where measurement reticle RT is loaded on reticle stage RST. Incidentally, pinhole patterns $PH_1$ to $PH_{33}$ are formed within an area having a size of a slit-shaped illumination area that is indicated by a dotted line in FIG. 13.

In this case, as the predetermined preparatory operations, detection of a relative position of measurement reticle RT to projection optical system PL, baseline measurement of alignment detection system AS and the like are performed. That is, using a reticle alignment system (not shown), a position relation is detected between a pair of first fiducial marks formed on a fiducial mark plate (not shown) on wafer stage WST and images of reticle alignment marks, which correspond to the first fiducial marks, on measurement reticle RT via projection optical system PL. The detection of the position relation is performed in a state where reticle stage RST is moved to a position at which the area indicated by a dotted line on measurement reticle RT in FIG. 13 substantially coincides with the illumination area described previously. Next, by moving wafer stage WST a predetermined distance within the XY plane, a position relation with respect to the detection center of alignment detection system AS is detected, and the baseline of alignment detection system AS is measured based on the foregoing two position relations and the measurement values of interferometers 16 and 18 at the time of detecting the respective position relations.

In the next step, step 126, microlens array 98 is placed on optical axis AX1 by rotating optical system unit 93 of optical property measurement apparatus 90.

In the next step, step 128, a position relation between optical property measurement apparatus 90 attached to wafer stage WST and wafer stage WST is measured. More particularly, by sequentially moving wafer stage WST, each position on a wafer stage coordinate system of at least two two-dimensional position marks 91b on marking plate 91 of optical property measurement apparatus 90 is detected using alignment detection system AS. Based on the detection results of the positions, a position relation between opening 91a of marking plate 91 of optical property measurement apparatus 90 and wafer stage WST is accurately obtained using a predetermined statistical computation such as the least-squares method.

As a consequence, based on position information (velocity information) output from wafer interferometer 18, the XY-position of opening 91a can be accurately detected. Also, a position of opening 91a can be set at a desired XY-position with good precision, by controlling the position of wafer stage WST based on the detection result of the XY-position and the baseline measured previously.

In the next step, step 130, a tilt of marking plate 91 with respect to a plane (the XY-plane) perpendicular to optical axis AX of projection optical system PL is measured, using the multipoint focal position detection system (21, 22). In the next step, step 132, by adjusting a tilt of wafer stage WST based on the measurement result of the tilt of marking plate 91, a tilt of the upper surface of marking plate 91 is made to coincide with a tilt of an image plane (or an approximate plane of the image plane) of projection optical system PL.

In the next step, step 134, wafer stage WST is moved so that opening 91a of marking plate 91 of optical property measurement apparatus 90 coincides with a datum measurement point in the field of projection optical system PL, for example, a measurement point at the field center, that is, a measurement point at a position (on optical axis AX) conjugate with pinhole pattern $PH_{17}$ with respect to projection optical system PL as shown in FIG. 13. With this operation, optical axis AX of optical systems to be examined (illumination optical system 12 and projection optical system PL) becomes coincident with optical axis AX1 of optical property measurement apparatus 90.

In the next step, step 136, a polarization state of illumination light IL is set. Specifically, main controller 20 adjusts a polarization direction of laser beam LB by rotating the half wave plate or the like in polarization control unit 2. In this case, a rotation amount of the half wave plate is adjusted so that illumination light IL becomes the H polarized light.

In the next step, step 138, an optimal Z position (a best focus position) of wafer stage WST is searched, based on imaging data IMD1 that is the imaging results of the image of pinhole pattern $PH_{17}$ formed again on the light-receiving surface of CCD 95a by each microlens constituting microlens array 98. The search processing will be specifically described below.

Figure 14A:
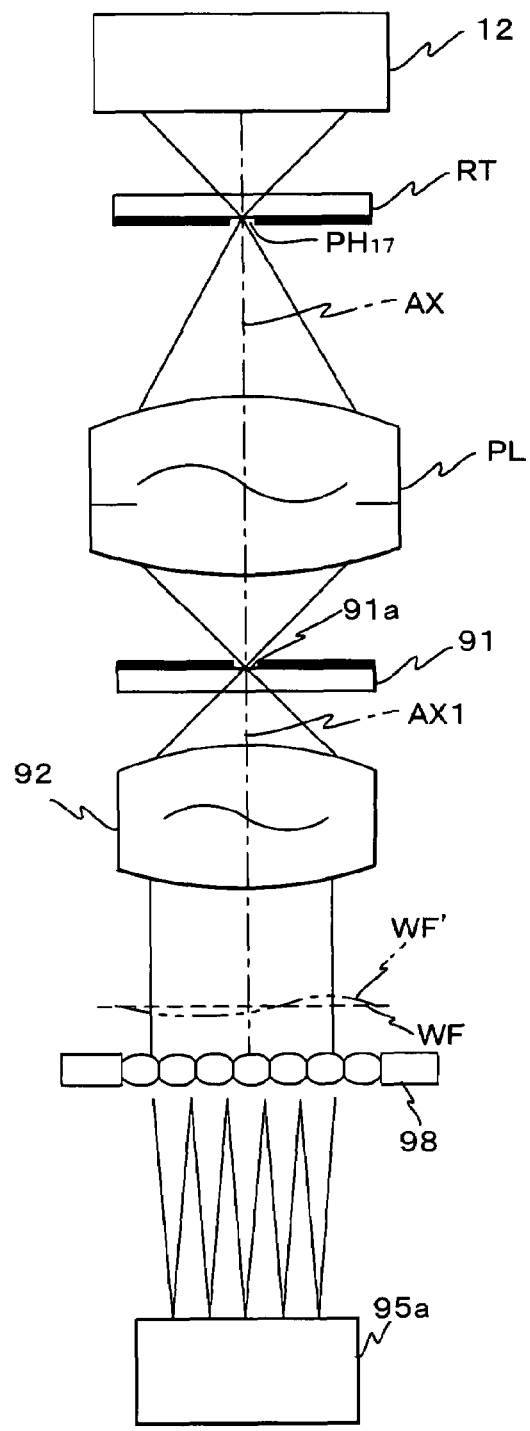
FIG. 14A is a view showing an optical arrangement when wavefront aberration is measured.

The optical arrangement when performing the search of the optimal Z position, which is developed along optical axis AX1 of optical property measurement apparatus 90 and optical axis AX of projection optical system PL, is shown in FIG. 14A. In the optical arrangement shown in FIG. 14A, when main controller 20 makes light source 1 oscillate laser beam LB and illumination light IL is emitted from illumination optical system 12, the light (illumination light IL) that reaches pinhole pattern $PH_{17}$ of measurement reticle RT is emitted from pinhole pattern $PH_{17}$ as a spherical wave. Then, the light is condensed at opening 91a of marking plate 91 of optical property measurement apparatus 90 after passing through projection optical system PL. Incidentally, the light passing through pinhole patterns $PH_1$ to $PH_{16}$, and $PH_{18}$ to $PH_{33}$ other than pinhole pattern $PH_{17}$ does not reach opening 91a. The wavefront of the light condensed at opening 91a in the manner described above (the beam of the image of pinhole pattern $PH_{17}$ formed inside opening 91a on the surface of marking plate 91) becomes a rough sphere including wavefront aberration of projection optical system PL.

The light passing through opening 91a is converted by collimator optical system 92 into parallel beams and enters microlens array 98. Each microlens (refer to FIG. 14A) of microlens array 98 forms an image of pinhole pattern $PH_{17}$, which has been formed inside opening 91a on the surface of marking plate 91, on an optically conjugate plane of marking plate 91, that is, the imaging plane (the light-receiving surface) of CCD 95a. Accordingly, on the imaging plane of CCD 95a, spot images (images of pinhole pattern $PH_{17}$) which arrangement and number correspond to those of microlenses constituting microlens array 98 are formed. CCD 95a picks up the spot images formed on the imaging plane (the light-receiving surface). Imaging data IMD1 obtained by the pickup of CCD 95a is transmitted to main controller 20.

Then, while stepping wafer stage WST in the Z-axis direction via wafer stage drive system 24, imaging data IMD1 is loaded. Based on the loaded imaging data IMD1, the optimal Z position of wafer stage WST is searched by locating a position in the Z-axis direction where, for example, contrast of spot images is at maximum.

In the next step, step 140, polarization detection system 99 is placed on optical axis AX1 of illumination light IL by rotating optical system unit 93, and in step 142, a polarization state of illumination light IL is measured. The detection method of a polarization state of illumination light IL will be described below.

As is shown in FIG. 7, a transmitting orientation of polarization beam splitter 99B is to coincide with the X axis. In this state, quarter wave plate 99A is rotated. The rotation amount is expressed by θ using the X axis as a datum. In this case, the quarter wave plate can be rotated within a range of 0 degree<θ<360 degrees, and CCD 95a receives illumination light IL every time quarter wave plate 99A is rotated by a predetermined rotation angle, and from the light-receiving results, a polarization state of illumination light IL is computed.

Intensity I(θ) of the light that polarization beam splitter 99B transmits is given by the following equation.

[Equation 1]

$$I(\theta)=I_0(2+\cos 2\alpha+\cos 2\alpha \cos 4\theta-2\sin 2\alpha \sin\delta \sin 2\theta+\sin 2\alpha \cos 2\delta \sin 4\theta) \quad (1)$$

In this case, $I_0$ is the average of light intensity at all angles, α is a tangent of an amplitude between the X axis and the Y axis in the case illumination light IL is to be an elliptically polarized light, and δ is a phase difference between two electric vectors which oscillation directions in illumination light IL are the X-axis direction and the Y-axis direction.

Figure 15:
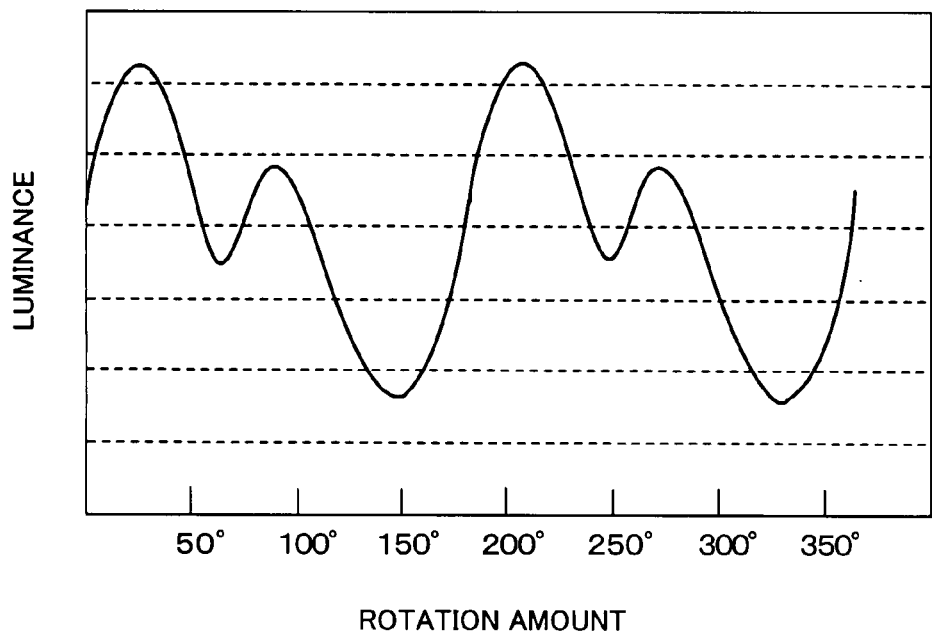
FIG. 15 is a view showing an example of a measurement result obtained when measuring a polarization state.

FIG. 15 shows an example of measurement results of the intensity of illumination light IL obtained by rotating quarter wave plate 99A. In the embodiment, CCD 95a receives illumination light IL, the light-receiving results are sent to main controller 20, and the light intensity change with respect to a rotation amount $\theta_i$ as shown in FIG. 15 is measured. Thus, main controller 20 computes Stokes parameters S0, S1, S2 and S3 by performing fast Fourier transform (FFT), more specifically, computing the following equation.

[Equation 2]

$$\left. \begin{array}{l} I_0 = \dfrac{1}{256}\sum_{i=1}^{256} I_i \\ \cos 2\alpha \cdot I_0 = \dfrac{1}{128}\sum_{i=0}^{256} I_i \cos 2\theta_i \\ \sin 2\alpha \cdot \cos\delta \cdot I_0 = \dfrac{1}{128}\sum_{i=0}^{256} I_i \sin 2\theta_i \end{array} \right\} \quad (2)$$

In this case, $I_i$ is light intensity measured at rotation amount $\theta_i$. From the computation results, main controller 20 computes Stokes parameters S1 to S3 of Stokes parameters S0, S1, S2 and S3 shown in the following equation.

[Equation 3]

$$S0=1,\ S1=\cos 2\alpha,\ S2=\sin 2\alpha\cdot\cos\delta,\ S3=\sin 2\alpha\cdot\sin\delta \quad (3)$$

Incidentally, Stokes parameters S1 to S3 are parameters that are normalized on the assumption that Stokes parameter S0 is equal to one (S0=1).

In the next step, step 144, main controller 20 judges whether or not illumination light IL is the H polarized light, based on the computed values of Stokes parameters S1 to S3.

Figure 11:
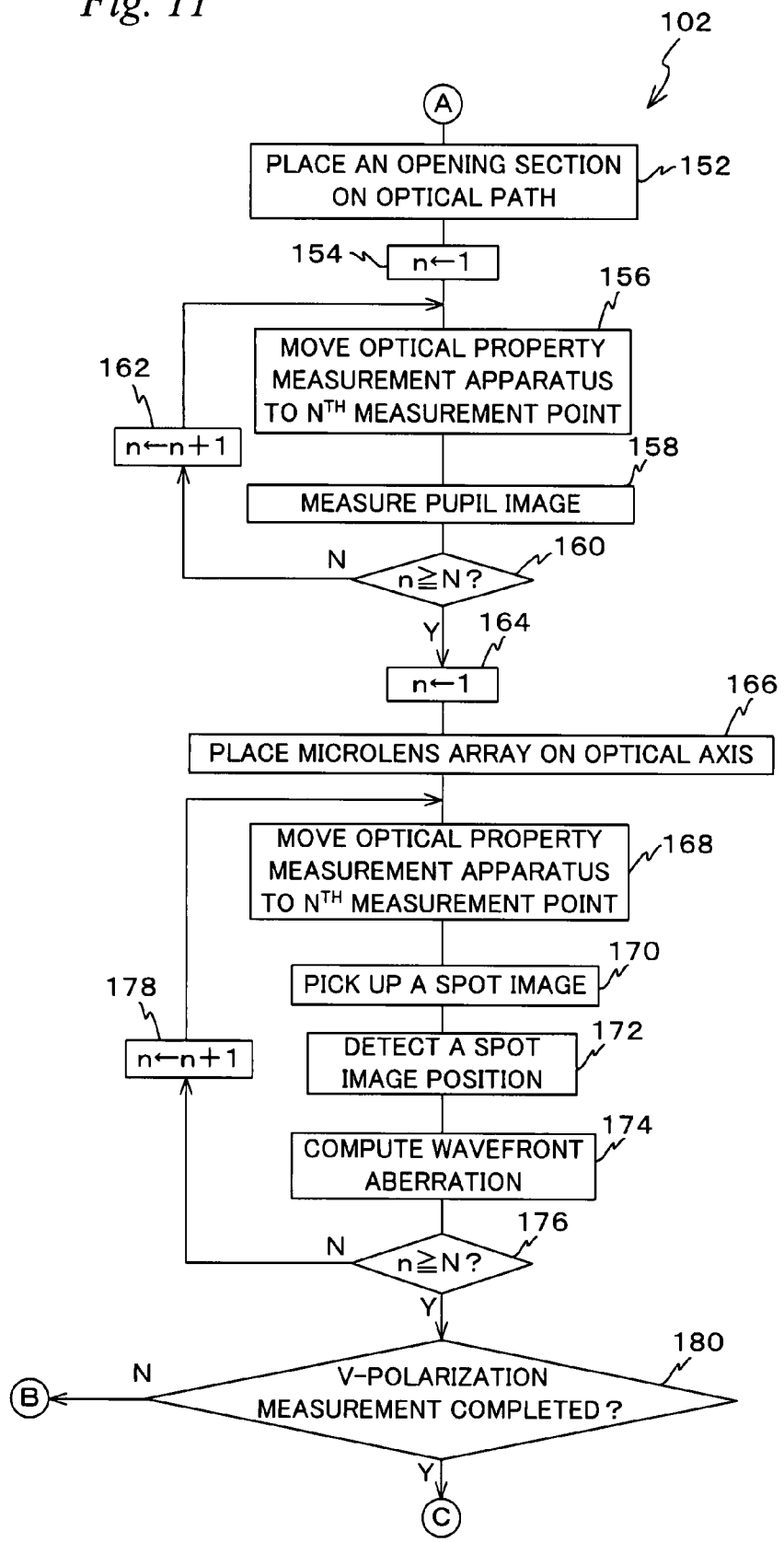
FIG. 11 is a flowchart (No. 2) showing measurement processing of an optical property.

When the judgment is affirmed, the procedure proceeds to step 152 in FIG. 11. On the other hand, in the case the judgment in step 144 is denied, the procedure proceeds to step 146, in which the polarization state of illumination light IL is adjusted by adjusting polarization control unit 2 based on the computed values of Stokes parameters S1 to S3. For example, in the case illumination light IL has strong elliptic polarized nature, a polarizer within polarization control unit 2 is adjusted so that illumination light IL becomes a linearly polarized light. In the case illumination light IL is a linearly polarized light but the polarization direction is deviated from the X-axis direction, a rotation amount of the half wave plate within polarization control unit 2 is adjusted so as to make the polarization direction become the X-axis direction, that is, become the H polarization. After step 143 ends, the procedure returns to step 142.

Afterward, until the judgment in step 144 is affirmed, the polarization state of illumination light IL is adjusted in step 146 by, for example, performing rotation adjustment of the half wave plate or the quarter wave plate of polarization control unit 2, or the like, and then the procedure returns to step 142, and the processing for measuring the polarization state of illumination light IL as described above is repeated again. With these operations, eventually illumination light IL becomes the H polarized light.

After illumination light IL is adjusted so as to be the H polarized light in this manner, in step 152 in FIG. 11, opening section 97 is placed on optical axis AX1 by rotating optical system unit 93. In the next step, step 154, a value of a counter n (hereinafter referred to as a 'counter value n') is initialized to one.

In step 156, optical property measurement apparatus 90 is moved to the $n^{th}$ (the first in this case) measurement point. That is, wafer stage WST is moved so that opening 91a of marking plate 91 of optical property measurement apparatus 90 coincides with the measurement point at a position conjugate with the $n^{th}$ pinhole pattern $PH_n$ with respect to projection optical system PL.

Figure 14B:
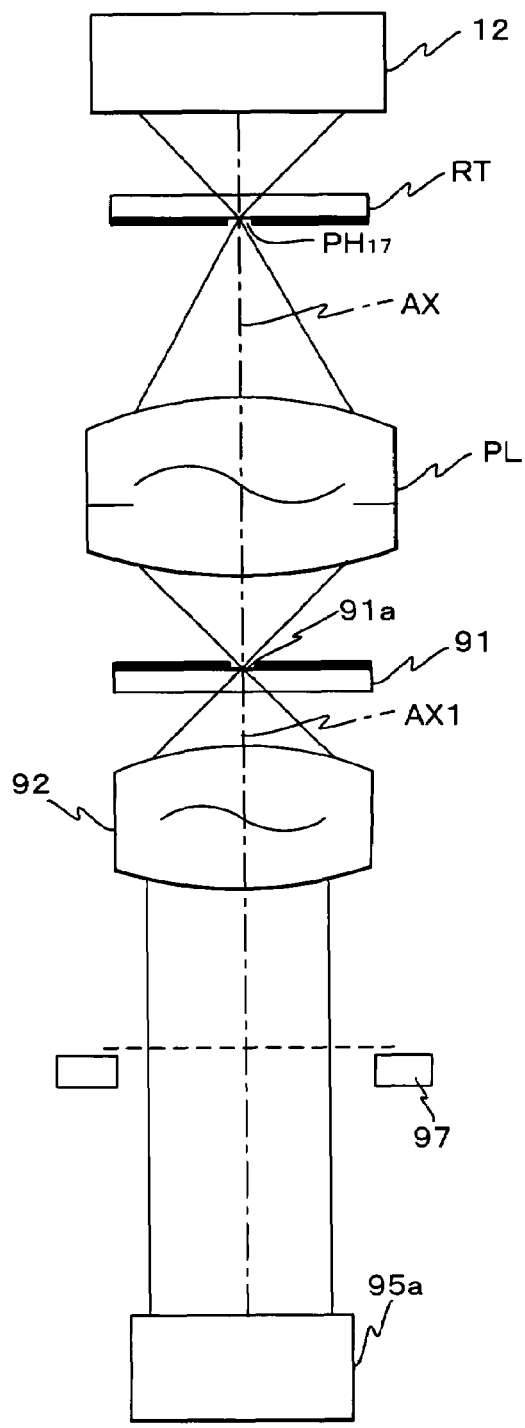
FIG. 14B is a view showing an optical arrangement when a pupil image is measured.

In the next step, step 158, pupil image measurement is performed. FIG. 14B shows a state of the pupil image measurement. As is shown in FIG. 14B, in this state, since opening section 97 is placed on the optical path of illumination light IL, the parallel beams via collimator optical system 92 directly enters CCD 95a. In other words, CCD 95a can be regarded to be placed at a position conjugate with the pupil plane of projection optical system PL and can receive the beam corresponding to the pupil image on the pupil plane. Therefore, in this case, imaging data IMD2 of CCD 95a is loaded and based on imaging date IMD2, the center position and size of the pupil image, or the intensity distribution of the pupil images are/is detected. Then, the detection results are stored in a memory.

In the next step, step 160, the judgment is made of whether or not the pupil image measurement is completed at all measurement points, by judging whether or not counter value n is equal to or greater than the total number N (N=33 in this case). At this stage, since only the pupil image measurement at the first measurement point ends, the judgment in step 160 is denied. Then, the procedure proceeds to step 162, in which counter value n is incremented by one, and the procedure returns to step 156.

Afterward, until the judgment in step 160 is affirmed, the processing and judgment of a loop of steps 156→158→160→162 are repeated. With these operations, the pupil image measurement is performed at the $2^{nd}$ to $33^{rd}$ measurement points within the field of projection optical system PL, that is, at the measurement points at the positions conjugate with pinhole patterns $PH_2$ to $PH_{33}$ with respect to projection optical system PL, and the center position and size of the pupil image via each of pinhole patterns $PH_2$ to $PH_{33}$, or the intensity distribution of the pupil images are/is computed and stored in a memory.

Then, when the pupil image measurement at all measurement points is completed, the procedure proceeds to step 164, in which counter value n is initialized to one.

In the next step, step 166, microlens array 98 is placed again on optical axis AX1 by rotating optical system unit 93, then in step 168, optical property measurement apparatus 90 is moved to the $n^{th}$ (the first in this case) measurement point. That is, wafer stage WST is moved so that opening 91a of marking plate 91 of optical property measurement apparatus 90 coincides with the measurement point at a position conjugate with the $n^{th}$ pinhole pattern $PH_n$ with respect to projection optical system PL.

In the next steps, steps 170 to 174, wavefront aberration measurement at the $n^{th}$ measurement point is carried out. That is, first, in step 170, all spot images formed on the light-receiving surface of CCD 95a by microlens array 98 is picked up, and its imaging data IMD1 is loaded.

In the next step, step 174, the position information on each spot image is read out from the memory, and the wavefront aberration of projection optical system PL related to the light via the $n^{th}$ (the first in this case) pinhole pattern $PH_1$ of measurement reticle RT is computed in the manner that will be described later.

The reason why the wavefront aberration can be measured from the position information on the spot image is that the wavefront of the light incident on microlens array 98 is reflected by the wavefront aberration of projection optical system PL when picking up the spot image.

In other words, when there is no wavefront aberration in projection optical system PL, a wavefront WF becomes a plane orthogonal to optical axis AX1 as shown by a dotted line in FIG. 14A. In this case, the wavefront of the light incident on microlens array 98 is orthogonal to the optical axis, and the spot image that has the center at the intersection point of the optical axis of each microlens of microlens array 98 with the imaging plane of CCD 95a is formed on the light-receiving surface of CCD 95a. Meanwhile, when there is wavefront aberration in projection optical system PL, a wavefront WF' does not become a plane orthogonal to optical axis AX1, but becomes a tilted surface having an angle according to a position of wavefront WF' on the plane, as shown by a double-dashed line in FIG. 14A. In this case, the wavefront of the light incident on microlens array 98 is tilted, and the spot image that has the center at a point deviated a distance corresponding to the tilted amount from the intersection point of the optical axis of each microlens with the light-receiving surface of CCD 95a is formed on the light-receiving surface of CCD 95a.

Accordingly, in step 174, the wavefront aberration of projection optical system PL related to the light via the $n^{th}$ pinhole pattern $PH_n$ of measurement reticle RT is computed, by obtaining a coefficient of a Zernike polynomial from the difference (the position error) between the position of each spot image expected when there is no wavefront aberration (the intersection point of the optical axis of each microlens with the imaging plane of CCD 95a) and the detected position of each spot image.

However, the position of each spot image expected when there is no wavefront aberration coincides with the intersection point of the optical axis of each microlens of microlens array 98 with the light-receiving surface of CCD 95a, only in the ideal case where there is no deviation in the optical axis of the incident light and optical axis AX1 and CCD 95a are accurately orthogonal. Thus, in the embodiment, when computing the above position error, based on data on the light source image (the position information on the light source image such as the center position and the size) at the corresponding measurement point stored in the memory, the position of each spot image expected when there is no wavefront aberration (a datum position used to compute a deviation amount of each spot image) is respectively corrected, and the difference between the detected position of each spot image and each datum position corrected is computed. With this operation, the error of the datum position of each spot image when there is no wavefront aberration, which is caused by the deviation in the optical axis of the light incident on optical property measurement apparatus 90, can be cancelled, and the wavefront aberration can be obtained with higher precision.

Referring back to FIG. 11, in the next step, step 176, the judgment is made of whether or not measurement of wavefront aberration at all measurement points is completed by judging whether or not counter value n is equal to or greater than the total number N (N=33 in this case). At this stage, because only measurement of wavefront aberration at the first measurement point ends, the judgment is denied, and the procedure shifts to step 178, in which counter value n is incremented by one, and then returns to step 168.

Afterward, until the judgment in step 176 is affirmed, the processing of a loop of steps 168→170→172→174→176→178 is repeated. With these operations, the wavefront aberration measurement is performed at the $2^{nd}$ to $33^{rd}$ measurement points within the field of the projection optical system PL, that is, at the measurement points at the positions conjugate with pinhole patterns $PH_2$ to $PH_{33}$ with respect to projection optical system PL, and the wavefront aberration related to the light via each of pinhole patterns $PH_2$ to $PH_{33}$ is computed, and stored in a memory (not shown).

Then, when the wavefront aberration measurement at all measurement points is completed and the judgment in step 176 is affirmed, the procedure proceeds to the next step, step 180.

In step 180, the judgment is made of whether or not the measurement is completed in the case illumination light IL is to be a V polarized light (a linearly polarized light having the polarization direction in the Y-axis direction). In this case, since only the measurement of the H polarized light ends, the judgment in step 180 is denied, and the procedure returns to step 136 in FIG. 10.

In step 136, the half wave plate of polarization control unit 2 is rotated by 90 degrees, and the polarization direction of laser beam LB is changed by 90 degrees. With this operation, illumination light IL is set to be a V polarized light. Then, in step 138, the optimal Z position of wafer stage WST is newly searched. In this case, the reason why the optimal Z position is searched again is that the wavefront corresponding to each measurement point changes due to the change in the polarization direction of illumination light IL, and also the optimal Z position is likely to change due to the change in the wavefront. Then, in steps 140 to 144, and steps 152 to 176 in FIG. 11, the pupil image and the wavefront at each measurement point corresponding to conventional illumination aperture stop 6D when illumination light IL is set to be the V polarized light. After the measurement of the V polarized light is completed in this manner, the judgment in step 180 is affirmed, and the procedure proceeds to step 182 in FIG. 12.

Figure 12:
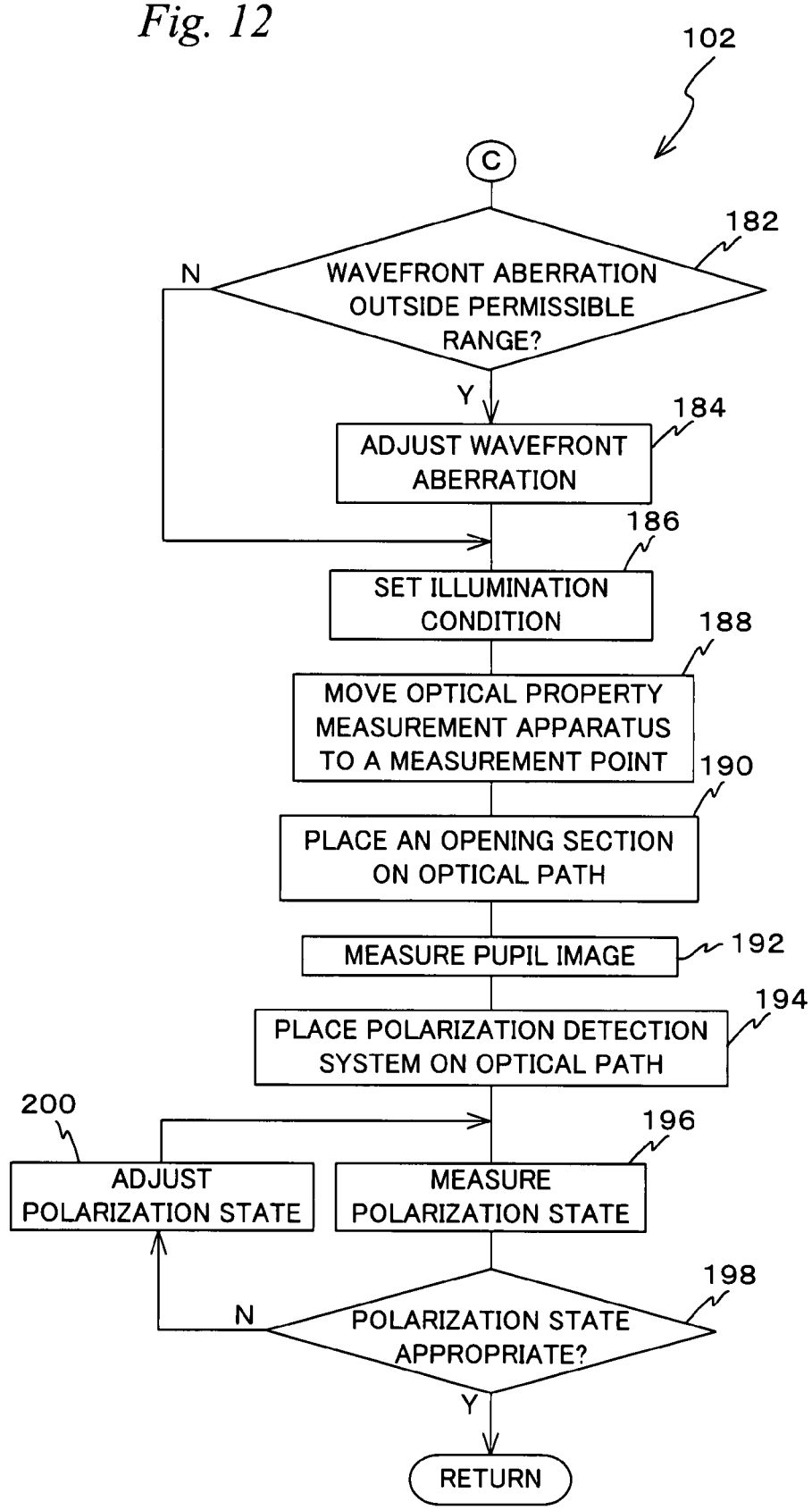
FIG. 12 is a flowchart (No. 3) showing measurement processing of an optical property.

In step 182 in FIG. 12, based on the data of wavefront aberration at N number of (in this case, 33) measurement points within the field of projection optical system PL obtained above, the judgment is made of whether or not there is the measurement point at which the wavefront aberration of projection optical system PL is outside a permissible range. Then, in the case the judgment is affirmed, the procedure shifts to step 184, and adjustment of the wavefront aberration of projection optical system PL is performed by driving a lens element via image-forming characteristic correction controller 51 so that the wavefront aberration generated at present is reduced, based on the measurement results of the wavefront aberration of projection optical system PL. The adjustment is set based on the illumination condition that is set on actual exposure. For example, exposure is performed with annular illumination, the adjustment is preferably set so that the wavefront is optimum in a portion where illumination light IL passes through with the annular illumination aperture stop. Further, in the embodiment, as will be described later, the polarization direction of illumination light IL is along the circumferential direction of a circle having optical axis AX as the center and the polarization directions of illumination light IL are different in different areas on the pupil plane, and therefore, projection optical system PL is preferably adjusted so that the wavefront aberration is reduced to the minimum in that polarization state. Incidentally, depending on circumstances, the lens element of projection optical system PL may be moved within the XY plane or may be exchanged by hand.

Figure 16:
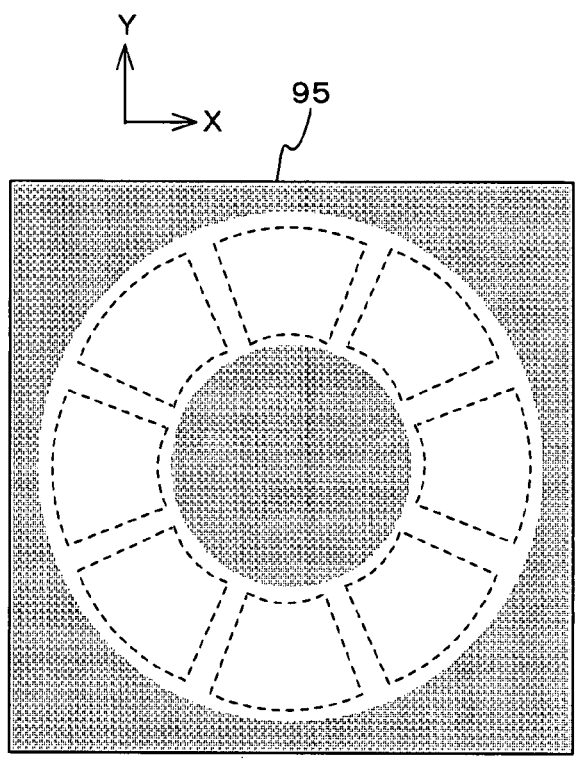
FIG. 16 is a view showing an example of an imaging result of a pupil image.

After the judgment is denied in step 182, or after the procedure in step 184 is performed, in step 186, an illumination condition that is applied to actual exposure is set. Specifically, polarization control unit 2 makes the polarization direction of laser beam LB to the H polarization and polarization conversion member 3A is placed on the optical path of illumination light IL by rotating polarization conversion unit 3, and also annular illumination aperture stop 6A is placed on the optical path of illumination light IL by rotating illumination system aperture stop plate 6 by drive unit 7. Then, in step 188, optical property measurement apparatus 90 is moved to the measurement point, and in step 190, opening section 97 of optical system unit 93 is placed on the optical path, and then in step 192, the pupil image is measured. In this case, since annular illumination aperture stop 6A is placed on the optical path of illumination light IL, the pupil image also have an annular shape. Here, imaging data IMD2 of the pupil image is loaded, and the position and size of the pupil image on the light-receiving surface of CCD 95a, or the intensity distribution of the pupil images are/is detected based on imaging data IMD2, and the detection results are stored in a memory. FIG. 16 shows an example of imaging data IMD2 of the pupil image at this point of time. In the image in FIG. 16, a portion where luminance is higher than a predetermined threshold is shown in white, and a portion where luminance is lower is shown in grey. As is shown in FIG. 16, a shape of the portion where luminance is higher is a shape of the pupil image, and in the case the annular illumination is employed, the pupil image has an annular shape. In this case, position information on the portion where luminance is higher within CCD 95a is stored in a storage unit. Further, in the storage unit, a distribution state of the luminance related to the portion having higher luminance is also stored.

In the next step, step 194, polarization detection system 99 is placed on optical axis AX1 by rotating optical system unit 93 in optical property measurement apparatus 90, and in step 196, a polarization state of illumination light IL is measured.

In this case, annular illumination aperture stop 6A is selected as the illumination aperture stop of illumination optical system 12, and illumination light IL is to be a linearly polarized light which polarization direction is in a circumferential direction of a circle having optical axis AX as the center. Thus, here, based on the position and size of the pupil image that have been measured in step 192 above, an area on the light-receiving surface of CCD 95a is divided, for example, as is indicated by dotted lines in FIG. 16, and the polarization direction is measured with respect to each divided area based on the computed values of Stokes parameters S1 to S3.

Then, in step 198, the judgment is made of whether or not a polarization state of illumination light IL is a desired state (i.e. a linearly polarized light in the circumferential direction of a circle having optical axis AX as the center), and in the case the judgment is affirmed, the processing of subroutine 102 ends, and in the case the judgment is denied, the procedure proceeds to step 200, in which the polarization state of illumination light IL is adjusted by adjusting a rotation amount of the wave plate of polarization control unit 2 or the like, then the procedure returns to step 196. That is, until the judgment is affirmed in step 198, the processing and judgment of steps 196→198→200 are repeated.

After the judgment in step 198 is affirmed, the processing of subroutine 102 ends, and the procedure proceeds to step 104 in FIG. 9.

In step 104, measurement reticle RT loaded on reticle stage RST is unloaded and reticle R on which a pattern to be transferred is formed is loaded on reticle stage RST via a reticle loader (not shown).

In the next step, step 106, reticle alignment using the reticle alignment system described previously and a fiducial mark plate (not shown), and baseline measurement using alignment detection system AS and the fiducial mark plate are performed in the procedure similar to that of a conventional scanning stepper.

In the next step, step 108, the wafer on wafer stage WST is replaced using a wafer loader (not shown). (When a wafer is not loaded on wafer stage WST, however, a wafer is simply loaded.)

In the next step, step 110, alignment to wafer W (e.g. wafer alignment by the EGA method) is performed. As a result of the wafer alignment, an array coordinate of a plurality of shot areas on wafer W is obtained with good precision.

In the next step, step 112, based on the results of the wafer alignment described above, exposure by a step-and-scan method is performed, in which an operation in which wafer stage WST is moved to a scanning starting position (an acceleration starting position) for exposure of each shot area on wafer W, and an operation in which reticle R is illuminated with illumination light IL and a pattern of reticle R is transferred onto the shot area on wafer W while relatively scanning reticle stage RST and wafer stage WST synchronously in the Y-axis direction are repeated. In the exposure, by the annular illumination in which the polarized direction of illumination light IL is defined as is shown in FIG. 8, exposure with high resolution is achieved.

During the relative scanning, in particular, during the scanning exposure, position control of reticle stage RST and wafer stage WST is performed so as to keep a position relation between reticle stage RST and wafer stage WST appropriate, based on information on the XY position of reticle stage RST detected by reticle interferometer 16, position information on wafer stage WST detected by wafer interferometer 18, and the Z position of wafer W detected by multipoint focal position detection system (21, 22), leveling information, and the like.

In the next step, step 114, the judgment is made of whether or not exposure of the planned number of wafers (e.g. 1 lot) is completed. When the judgment is denied, the procedure returns to step 108, and until the judgment in step 114 is affirmed, the processing and judgment of a loop of steps 108→110→112→114 are repeatedly performed, and exposure to each wafer is performed.

Then, when exposure to the planned number of wafers is completed, the judgment in step 114 is affirmed, and a series of processing in the main routine ends.

Incidentally, in the embodiment, the case has been described where annular illumination aperture stop 6A is placed on the optical path of illumination light IL and exposure is performed with annular illumination. However, in exposure apparatus 100, exposure can also be performed with quadrupole illumination or bipolar illumination by placing quadrupole illumination aperture stop 6B or bipolar illumination aperture stop 6C on the optical path of illumination light IL. In these cases, in the setting of illumination condition in step 186 above (refer to FIG. 12), quadrupole illumination aperture stop 6B (or bipolar illumination aperture stop 6C) and polarization conversion member 3B (or opening member 3C) are placed, and in the measurement of a polarization state in step 196 above (refer to FIG. 12), the setting of the area where a polarization state is measured needs to be changed according to the shape of the pupil image measured in step 192 above. For example, in the case quadrupole illumination aperture stop 6B is employed, measurement is performed in step 196 above (refer to FIG. 12) as to whether the polarization state is as shown in FIG. 4B. In this case, from the shape and position of the pupil image of the quadruple illumination aperture stop (four eyes) measured in step 192 above, the areas on CCD 95a corresponding to polarization conversion members (3Ba to 3Bd) in FIG. 4B are extracted, and based on the measurement results in the extracted areas, each polarization state has to be measured.

Further, the adjustment of the wavefront aberration in step 184 above (refer to FIG. 12) is performed based on the illumination condition that is applied to exposure, and therefore, in the case quadrupole illumination aperture stop 6B or bipolar illumination aperture stop 6C is selected as the illumination system aperture stop, the wavefront is adjusted in accordance with the selected aperture stop.

As is described so far, according to the embodiment, optical system unit 93 is installed, which has a plurality of optical systems including microlens array 98 that converts illumination light IL passing through illumination optical system 12 and projection optical system PL so that the polarization state of illumination light IL, the wavefront aberration of projection optical system PL, and the like can be measured, polarization detection system 99, and the like. Thus, by switching the optical system to be placed on the optical path of illumination light IL and receiving illumination light IL via optical system unit 93 with photodetector 95, various optical properties including the polarization state of illumination light IL and the wavefront aberration of projection optical system PL can be measured based on the light-receiving results of CCD 95a.

Further, in the embodiment, since common photodetector 95 can be used for measuring various optical properties including the polarization state of illumination light IL and the wavefront aberration of projection optical system PL, the configuration of optical property measurement apparatus 90 can be reduced in size and weight.

Further, in the embodiment, the polarization state of illumination light IL on a pattern image plane of exposure apparatus 100 can be measured using optical property measurement apparatus 90, and therefore, in the case polarized illumination is performed in order to improve the resolution, whether or not the polarization state of illumination light IL is a desired state can be confirmed, which makes it possible to perform highly-accurate exposure without fail.

Further, in the embodiment, based on the light-receiving results obtained from the areas within the light-receiving surface of CCD 95*a* that are conjugate with a plurality of different areas within the pupil plane of projection optical system PL, the polarization state of illumination light IL in the areas are measured. In this manner, in the case the polarization directions of illumination light IL are different in the different areas on the pupil plane of projection optical system PL as in the polarized illumination, the polarization direction in each area can be measured without fail.

Further, in the embodiment, polarization detection system 99 in optical system unit 93 of optical property measurement apparatus 90 is equipped with polarization beam splitter 99B and quarter wave plate 99A that rotate relatively to each other around the optical axis of illumination light IL. With this arrangement, the light quantity of illumination light IL that passes through polarization detection system 99 changes in accordance with the polarization state due to the change in a relative rotation amount of polarization beam splitter 99B and quarter wave plate 99A. Therefore, the polarization state of illumination light IL can be measured by measuring the light quantity of illumination light IL passing through polarization detection system 99 while changing the relative rotation amount.

Further, according to the embodiment, the polarization state of illumination light IL is measured in step 142 described above, the polarization state of illumination light IL is adjusted in step 146 based on the measurement results, and then the wavefront of illumination light IL that changes according to the polarization state of illumination light IL is measured in step 174. In this manner, even when the wavefront of illumination light IL relies on the polarization state, the wavefront can be measured with good accuracy after the adjustment of the polarization state. Thus, according to the embodiment, the wavefront per polarization corresponding to the polarization state of illumination light IL is measured. In this manner, the wavefront can be adjusted in accordance with the polarization state of illumination light IL, and as a consequence, exposure with high precision can be achieved.

Incidentally, in the embodiment above, optical system unit 93 of optical property measurement apparatus 90 is equipped with opening section 97, microlens array 98 and polarization detection system 99. However, other optical systems may be arranged in optical system unit 93.

Further, numerical aperture NA of projection optical system PL can also be measured by using optical property measurement apparatus 90. When a diffuser is placed on the optical path of illumination light IL within illumination optical system 12 to make a diameter of a beam passing though the diffuser larger than the numerical aperture of projection optical system PL, and opening section 97 of optical property measurement apparatus 90 is placed on optical axis AX1, the beam passing through the pupil of projection optical system PL reaches CCD 95*a*. Accordingly, from the imaging result of CCD 95*a*, a size of the pupil of projection optical system PL can be computed, which makes it possible to compute the numerical aperture of projection optical system PL.

When the numerical aperture of projection optical system PL can be computed in this manner, a coherence factor (the so-called illumination σ) of illumination optical system 12 can also be obtained, based on the measurement results of a pupil image (a light source image) in the case where the diffuser described above is removed.

Figure 17:
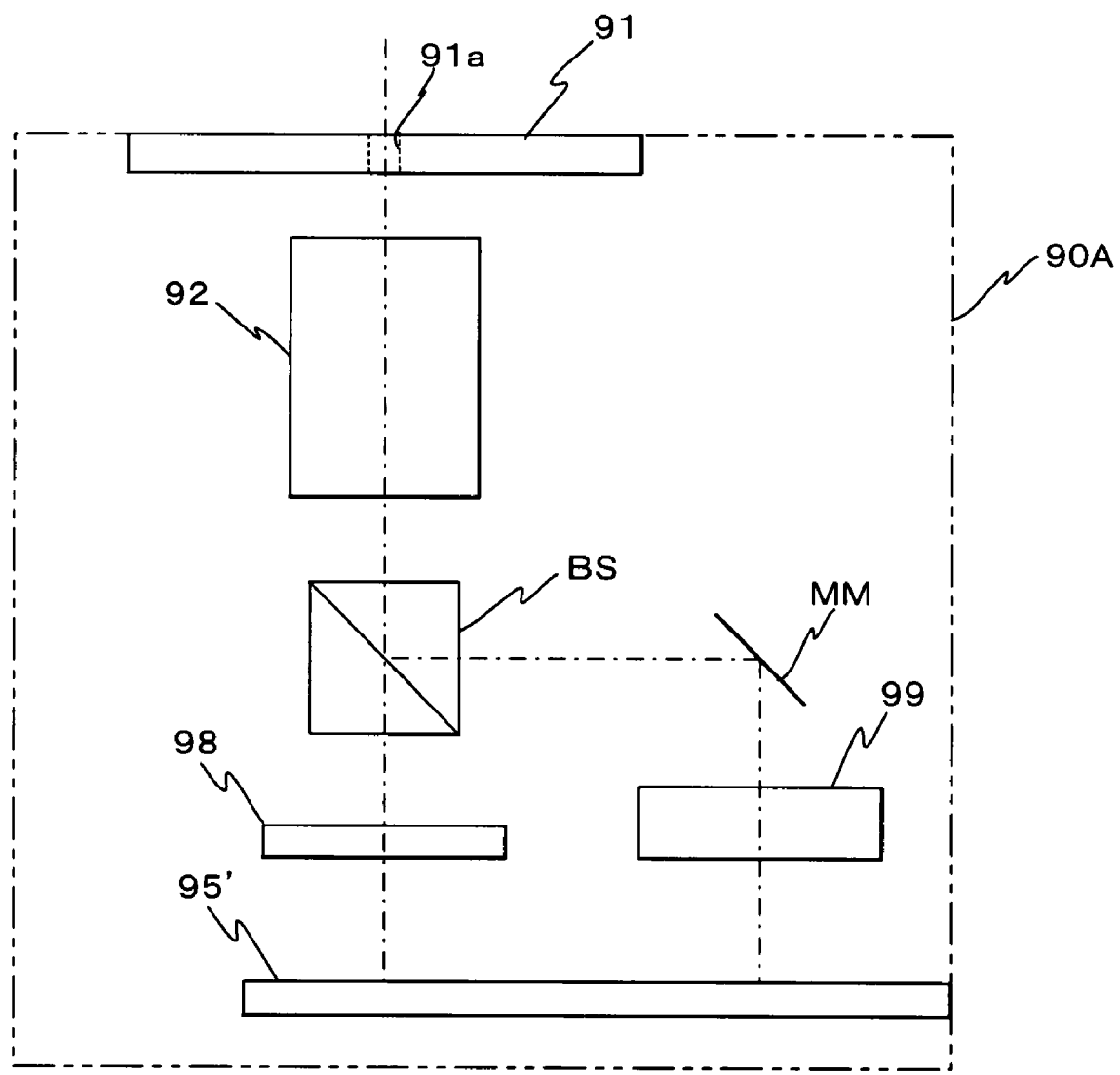
FIG. 17 is a view showing a configuration of a modified example of an optical property measurement apparatus.

Further, in the embodiment above, the case has been described where microlens array 98 and polarization detection system 99 of optical system unit 93 are switched to be selectively placed on the optical path of the light via collimator optical system 92 (at the position corresponding to optical axis AX1). However, the present invention is not limited to this. For example, an optical property measurement apparatus having a configuration as shown in FIG. 17 may be employed. The optical property measurement apparatus in FIG. 17 is equipped with marking plate 91 described previously that constitutes a part of the upper wall of a housing 90A, and collimator optical system 92, a beam splitter BS, microlens array 98 and a light-receiving element 95' that are sequentially arranged along optical axis AX1 below marking plate 91, and a deflecting mirror MM that is placed on a branched optical path (a reflection optical path) branched by beam splitter BS, polarization detection system 99 that is placed between deflecting mirror MM and light-receiving element 95', and the like.

In this case, as light-receiving element 95', a light-receiving element that has the configuration similar to light-receiving element 95 but has a larger light-receiving area is used. With the optical property measurement apparatus in FIG. 17, after a light (illumination light IL), which is emitted as a spherical wave from pinhole pattern PH of measurement reticle RT, is condensed at opening 91*a* of marking plate 91 of the optical property measurement apparatus via projection optical system PL. Then, the light passing through opening 91*a* (the beam of the image of pinhole pattern PH that is formed inside opening 91*a* on the surface of marking plate 91) is converted into parallel beams by collimator optical system 92, and enters beam splitter BS. Then, one of the beams branched by beam splitter BS (the beam passing through beam splitter BS) enters microlens array 98. Thus, an image of pinhole pattern PH is formed on a plane optically conjugate with marking plate 91, that is, the imaging plane (the light-receiving surface) of light-receiving element 95' respectively by each microlens of microlens array 98.

Meanwhile, the other of the beams branched by beam splitter BS (the beam reflected off beam splitter BS) is reflected off deflecting mirror MM and the optical path of the beam is deflected vertically downward, and the beam is received by light-receiving element 95' via polarization detection system 99.

Accordingly, with the optical property measurement apparatus shown in FIG. 17, the wavefront aberration measurement of projection optical system PL and the measurement of the polarization state of illumination light IL, which have been described in the embodiment above, can be performed in parallel.

Incidentally, in FIG. 17, light-receiving element 95' having a larger light-receiving area is used, however, light-receiving elements similar to light-receiving element 95 that respectively correspond to microlens array 98 and polarization detection system 99 may be arranged, or the configuration may be employed in which one light-receiving element is switchable between a position below microlens array 98 and a position below polarization detection system 99.

Incidentally, in recent years, the resolution of exposure apparatus has been improved to cope with a finer pattern formed on a device. In order to improve the resolution, the wavelength of an exposure light (illumination light IL in the embodiment above) only has to be shortened and the numerical aperture (NA) of a projection optical system only has to be larger. Then, a liquid immersion exposure apparatus is proposed in which the resolution is improved by filing the space between a projection optical system equipped in the exposure apparatus and a substrate (wafer W in the embodiment above) with a liquid having a refractive index higher than that of gas and substantially increasing the numerical aperture in size of the projection optical system.

The case will be described below where a measurement unit equivalent to optical property measurement apparatus 90 of the embodiment above is applied to the liquid immersion exposure apparatus.

Figure 18:
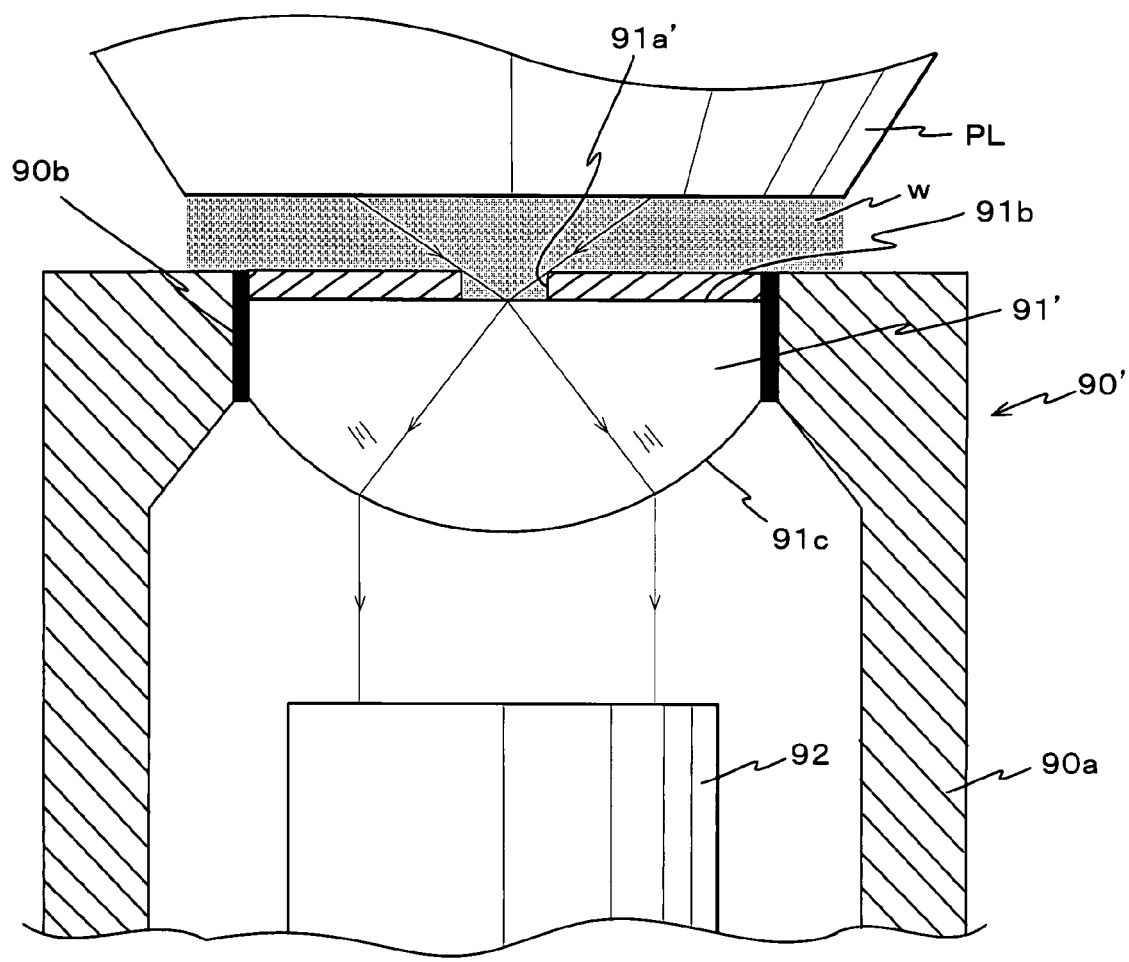
FIG. 18 is a view showing an example of a configuration of an optical property measurement apparatus in the case when the present invention is applied to a liquid immersion exposure apparatus.

In the case the measurement unit (which is to be an optical property measurement apparatus 90') that is equivalent to optical property measurement apparatus 90 is applied to the liquid immersion exposure apparatus, as is shown in FIG. 18, a marking plate 91' may be constituted by a planoconvex lens. Marking plate 91' is equipped with a flat section (a flat surface) 91b that faces a projection optical system PL side, and a curved surface section 91c that faces a collimator optical system 92 side and has a predetermined curvature. Marking plate 91' is made of glass materials that transmit illumination light such as quartz or fluorite.

On the surface of flat section 91b of marking plate 91', a light-shielding film is formed as is described previously, and in the center portion of the light-shielding film, a circular opening 91a' is formed. Moreover, in order to prevent a liquid w from entering inside optical property measurement apparatus 90', waterproof (a liquid-proof) measures are taken by a seal material 90b or the like between marking plate 91' and housing 90a of optical property measurement apparatus 90'. In addition, on the surfaces of opening 91a' of marking plate 91' and the area around opening 91a', a liquid repellant film (a water repellant coat) is formed.

In a state where liquid w is supplied to the space between projection optical system PL and the upper surface of marking plate 91', an exposure light incident on projection optical system PL is not totally reflected at the tip portion of projection optical system PL, and passes though projection optical system PL and enters liquid W. As is shown in FIG. 18, of the exposure light incident on liquid w, only the exposure light that enters opening 91a' enters inside marking plate 91'. In this case, since a refractive index of the planoconvex lens constituting marking plate 91' is approximately the same as that of liquid w or higher than that of liquid w, the exposure light incident on opening 91a' enters inside marking plate 91' without reflecting off flat section 91b even when an incident angle of the exposure light incident on opening 91a' is large. Further, the exposure light incident within marking plate 91' is deflected by curved surface section 91c, and then is emitted to collimator optical system 92. In this manner, even when the space between projection optical system PL and marking plate 91' is filled with a liquid that has a refractive index higher than that of gas to make the numerical aperture of the projection optical system larger, the exposure light can be guided to collimator optical system 92 via marking plate 91' constituted by a planoconvex lens.

Further, in the embodiment above, when measuring the wavefront aberration of projection optical system PL, measurement reticle RT is loaded on reticle stage RST. However, a pattern plate on which pinhole patterns are formed similar to measurement reticle RT is permanently arranged on reticle stage RST, and the pattern plate is positioned with the field of projection optical system PL and then the wavefront aberration of projection optical system PL may be measured.

Further, in the embodiment above, the case has been described where optical property measurement apparatus 90 is used for measurement of optical properties that is performed before exposure of wafer W in one lot. However, it is a matter course that optical property measurement apparatus 90 can be used at the time of periodic maintenance after assembly of the exposure apparatus, and at the time of adjustment of projection optical system PL when making the exposure apparatus. Incidentally, on the adjustment of projection optical system PL when making the exposure apparatus, in addition to position adjustment of a part of lens elements constituting projection optical system PL that is performed in the embodiment above, position adjustment of other lens elements, reprocessing of lens elements, exchange of lens elements, and the like can be performed.

Further, in the embodiment above, the aberration of the light-receiving optical system such as collimator optical system 92 inside optical property measurement apparatus 90 is to be small enough to be ignored. However, in the case such as when wavefront aberration measurement with higher precision is performed, the wavefront aberration of only the light-receiving optical system may be measured in advance at any time before the wavefront aberration is computed. Such wavefront aberration measurement of only the light-receiving optical system can be realized, by irradiating illumination light IL emitted from projection optical system PL to a pattern plate and measuring the wavefront aberration as described above in a state where the pattern plate on which a pinhole pattern that has a size large enough to generate a spherical wave by irradiation of illumination light IL via projection optical system PL is arranged in the vicinity of marking plate 91 and opening 91a is further restricted by the pinhole pattern of the pattern plate. Then, when computing the wavefront aberration of projection optical system PL, the wavefront aberration of only the light-receiving optical system may be used as a correction value.

Further, likewise, in order to obtain the wavefront aberration with good accuracy, dark current of CCD 95a is measured in advance at any time before computing the wavefront aberration, and when a value (a luminance value) of each pixel, an offset caused by the dark current may be corrected. Such offset correction may be performed in the case when the pupil image measurement described previously or the like is performed.

Further, in the embodiment above, opening member 3C is placed on the optical path of illumination light IL when performing bipolar illumination. However, as opening member 3C, a member that converts the polarization direction of illumination light IL into the H polarization may be arranged. The exposure apparatus, which is equipped with annular illumination aperture stop 6A, quadrupole illumination aperture stop 6B, bipolar illumination aperture stop 6C, conventional illumination aperture stop 6D and the like as aperture stops for illumination, has been described, however, the exposure apparatus may be equipped with other illumination aperture stops as a matter of course. Further, for example, small σ illumination having a σ value of illumination light IL equal to or less than around 0.4 may be used.

Further, in the embodiment above, the case has been described where optical property measurement apparatus 90 is permanently arranged at wafer stage WST. However, the present invention is not limited to this, and optical property measurement apparatus 90 may be detachable with respect to wafer stage WST. Further, another stage that is different from the wafer stage is arranged, and an optical property measurement apparatus similar to optical property measurement apparatus 90 may be placed on another stage.

Further, in the embodiment above, fly-eye lens 5 is used as an optical integrator. However, a micro fly-eye lens may be used instead. In this case, since the intensity distribution of light source images is further uniform than the case fly-eye lens 5 is used, it becomes easier to extract each pixel corresponding to the light source image. Further, as the optical integrator, an internal reflection type integrator (a rod integrator or the like) can be used, and in such a case, its virtual image is detected as a light source image.

Further, light source 1 of the exposure apparatus in the embodiment above is not limited to a pulsed ultraviolet light source such as an $F_2$ laser light source, an ArF excimer laser light source, and a KrF excimer laser light source, and an extra-high pressure mercury lamp that emits an emission line such as a g-line (wavelength: 436 nm) or an i-line (wavelength: 365 nm) can also be used. In addition, a harmonic wave may be used that is obtained by amplifying a single-wavelength laser beam in the infrared or visible range emitted by a DFB semiconductor laser or fiber laser, with a fiber amplifier doped with, for example, erbium (or both erbium and ytterbium), and by converting the wavelength into ultraviolet light using a nonlinear optical crystal. In addition, the magnification of the projection optical system is not limited to a reduction system, and an equal magnifying system or a magnifying system may be used.

Further, in the embodiment above, the case of a scanning exposure apparatus has been described, however, the present invention can be applied to any exposure apparatus comprising a projection optical system regardless of types of apparatus such as the step-and-repeat, the step-and-scan, and the step-and-stitching.

The usage of the exposure apparatus is not limited to the exposure apparatus for manufacturing semiconductors, and the present invention can also be widely applied to, for example, an exposure apparatus for liquid crystal that transfers a liquid crystal display device pattern onto a square shaped glass plate, and an exposure apparatus used for manufacturing organic EL, thin-film magnetic heads, micromachines, DNA chips or the like. In addition, the present invention can also be applied to an exposure apparatus that transfers a circuit pattern onto a glass substrate or a silicon wafer, not only when producing microdevices such as semiconductor devices, but also when producing a reticle or a mask used in exposure apparatuses such as an optical exposure apparatus, an EUV exposure apparatus, an X-ray exposure apparatus, or an electron beam exposure apparatus.

Semiconductor devices are manufactured through the following steps: a step where the function/performance design of a device is performed; a step where a reticle based on the design step is manufactured; a step where a wafer is manufactured using materials such as silicon; a step where a pattern formed on a reticle is transferred onto a wafer by the exposure apparatus of the embodiment described above; a device assembly step (including a dicing process, a bonding process, and a packaging process); inspection step, and the like.

INDUSTRIAL APPLICABILITY

As is described so far, the optical property measurement apparatus and the optical property measurement method of the present invention are suitable for measurement of optical properties of an optical system to be examined, and the exposure apparatus and the exposure method of the present invention are suitable for a lithography process for manufacturing semiconductor devices, liquid crystal display devices and the like. Further, the device manufacturing method of the present invention is suitable for manufacturing electron devices.

What is claimed is:

1. An optical property measurement apparatus that measures optical properties of an optical system to be examined, the apparatus comprising:

an incidence optical system on which a light via the optical system to be examined is incident;

an optical unit that has a first optical system that converts the light incident on the incidence optical system into a first measurement light in order to measure a first optical property among the optical properties of the optical system to be examined, and a second optical system that converts the light incident on the incidence optical system into a second measurement light in order to measure a second optical property among the optical properties of the optical system to be examined;

a placement unit that alternatively places the first optical system or the second optical system on an optical path of the light via the optical system to be examined; and a photodetector that receives the first measurement light or the second measurement light.

2. The optical property measurement apparatus according to claim 1, wherein the photodetector receives the first measurement light when the placement unit places the first optical system on the optical path of the light via the optical system to be examined, and receives the second measurement light when the placement unit places the second optical system on the optical path of the light via the optical system to be examined.

3. The optical property measurement apparatus according to claim 2, further comprising:

a computation unit that computes information related to the first optical property of the optical system to be examined or information related to the second optical property of the optical system to be examined, based on a light-receiving result of the photodetector.

4. The optical property measurement apparatus according to claim 3, wherein the computation unit computes the first optical property of the optical system to be examined based on a light-receiving result of the photodetector, in a state where the first optical system is placed on the optical path, and computes the second optical property of the optical system to be examined based on a light-receiving result of the photodetector, in a state where the second optical system is placed on the optical path.

5. The optical property measurement apparatus according to claim 1, further comprising:

an optical system that guides the light incident on the incidence optical system to the first optical system and also to the second optical system.

6. The optical property measurement apparatus according to claim 5, wherein the photodetector has a first light-receiving area that receives the first measurement light and a second light-receiving area that receives the second measurement light.

7. The optical property measurement apparatus according to claim 1, wherein the first optical property is a polarization state of the light via the optical system to be examined, and the first optical system is an optical system that can extract a polarized light in an arbitrary direction included in the light via the optical system to be examined.

8. The optical property measurement apparatus according to claim 7, wherein the computation unit measures a polarization state of the light in areas within a light-receiving surface of the photodetector that are conjugate with a plurality of different areas within a pupil plane of the optical system to be examined, based on light-receiving results obtained from the areas.

9. The optical property measurement apparatus according to claim 8, wherein
the first optical system includes a polarization beam splitter and a quarter wave plate that rotate relatively to each other around an optical axis of the light via the optical system to be examined.

10. The optical property measurement apparatus according to claim 1, wherein
the second optical property is wavefront aberration of the optical system to be examined, and
the second optical system includes a wavefront dividing optical element that divides a wavefront of the light via the optical system to be examined.

11. The optical property measurement apparatus according to claim 10, wherein
the second optical system is placed in the vicinity of a plane that is conjugate with a pupil plane of the optical system to be examined.

12. The optical property measurement apparatus according to claim 11, wherein
the optical unit further has a transmitting section that transmits the light via the optical system to be examined, and
the computation unit computes a third optical property among the optical properties of the optical system to be examined based on a light-receiving result of the photodetector, in a state where the transmitting section is placed on the optical path.

13. The optical property measurement apparatus according to claim 12, wherein
the third optical property is information related to a pupil plane of the optical system to be examined or information related to a plane conjugate with the pupil plane, or both.

14. The optical property measurement apparatus according to claim 13, wherein
the third optical property is a numerical aperture of the optical system to be examined, a shape of a pupil image, position information of the pupil image or an intensity distribution of the pupil image.

15. An exposure apparatus that projects an image of a predetermined pattern on a photosensitive object, the apparatus comprising:
an illumination optical system that illuminates the predetermined pattern with an illumination light;
a projection optical system that projects the illumination light via the predetermined pattern on the photosensitive object;
a stage that comprises the optical property measurement apparatus according to claim 1; and
an adjustment mechanism that adjusts an optical property of the illumination optical system or an optical property of the projection optical system, or both, based on a measurement result of the optical property measurement apparatus.

16. The exposure apparatus according to claim 15, wherein the stage is an object stage that holds the photosensitive object.

17. An optical property measurement apparatus that measures optical properties of an optical system to be examined, the apparatus comprising:
a polarization measurement instrument that measures a polarization state of a light via the optical system to be examined; and
an optical property measurement instrument that measures at least one optical property among the optical properties of the optical system to be examined.

18. The optical property measurement apparatus according to claim 17, wherein
among the optical properties of optical system to be examined, at least one optical property is wavefront aberration of the optical system to be examined.

19. The optical property measurement apparatus according to claim 18, further comprising:
an incidence optical system on which a light via the optical system to be examined is incident, and wherein
the polarization measurement instrument has a first optical system that converts the light incident on the incidence optical system into a first measurement light, and a photodetector that receives the first measurement light.

20. The optical property measurement apparatus according to claim 19, wherein
the optical property measurement instrument has a second optical system that converts the light incident on the incidence optical system into a second measurement light, and a photodetector that receives the second measurement light.

21. An exposure apparatus that projects an image of a predetermined pattern on a photosensitive object, the apparatus comprising:
an illumination optical system that illuminates the predetermined pattern with an illumination light;
a projection optical system that projects the illumination light via the predetermined pattern on the photosensitive object;
a stage that comprises the optical property measurement apparatus according to claim 17; and
an adjustment mechanism that adjusts an optical property of the illumination optical system or an optical property of the projection optical system, or both, based on a measurement result of the optical property measurement apparatus.

22. The exposure apparatus according to claim 21, wherein the stage is an object stage that holds the photosensitive object.

23. An optical property measurement method in which optical properties of an optical system to be examined are measured, the method comprising:
measuring a first optical property among the optical properties of the optical system to be examined;
adjusting the first optical property of the optical system to be examined, based on a result of the measurement;
measuring a second optical property among the optical properties of the optical system to be examined, after the first optical property of the optical system to be examined is adjusted; and
adjusting the second optical property of the optical system to be examined, based on a result of the measurement.

24. The optical property measurement method according to claim 23, wherein
in the case the first optical property is made to be different in different areas within a pupil plane of the optical system to be examined,
the optical property measurement method further comprises,
placing a light-receiving surface of a photodetector in areas that are conjugate with the different areas respectively, and measuring the first optical property of each area, based on a light-receiving result obtained from the photodetector.

25. An exposure method, comprising:
- measuring an optical property of an illumination optical system that illuminates a predetermined pattern with an illumination light or an optical property of a projection optical system that projects the illumination light via the predetermined pattern on a photosensitive object, or both, using the optical property measurement method according to claim 23;
- adjusting the optical property of the illumination optical system or the optical property of the projection optical system, or both, using a result of the measurement; and
- exposing the photosensitive object with an image of the predetermined pattern, after the adjustment.

26. A device manufacturing method including a lithography process wherein
- in the lithography process, a pattern is formed on a photosensitive object in the exposure method according to claim 25.

* * * * *